(12) United States Patent
Kozak et al.

(10) Patent No.: US 6,766,153 B2
(45) Date of Patent: Jul. 20, 2004

(54) DYNAMIC AUTOMATIC GAIN CONTROL CIRCUIT EMPLOYING KALMAN FILTERING

(75) Inventors: Marian Kozak, Holon (IL); Dan Raphaeli, Kfar Saba (IL)

(73) Assignee: Itran Communications Ltd., Beersheva (IL)

( * ) Notice: Subject to any disclaimer, the term of this patent is extended or adjusted under 35 U.S.C. 154(b) by 593 days.

(21) Appl. No.: 09/825,538

(22) Filed: Apr. 2, 2001

(65) Prior Publication Data

US 2002/0187765 A1 Dec. 12, 2002

(51) Int. Cl.$^7$ ............................................. H04B 7/00
(52) U.S. Cl. ......................... 455/232.1; 455/250.1; 330/75; 327/205
(58) Field of Search ..................... 455/232.1, 234.1, 455/236.1, 240.1, 245.1, 250.1, 255, 136, 138, 260; 330/75, 107, 103, 254, 278; 327/154, 155, 205, 323

(56) References Cited

U.S. PATENT DOCUMENTS

| | | | |
|---|---|---|---|
| 3,943,286 A | 3/1976 | Tsurushima | 179/1 GQ |
| 4,123,718 A | 10/1978 | Lampert et al. | 325/474 |
| 4,300,102 A | 11/1981 | Inoue | 330/254 |
| 4,349,883 A | 9/1982 | Doljack | 364/551 |
| 4,353,036 A | 10/1982 | Hoover | 330/264 |
| 4,499,429 A | 2/1985 | Sugimoto | 330/254 |
| 4,677,392 A | 6/1987 | Yang | 330/284 |
| 4,797,632 A | 1/1989 | Guery | 330/285 |
| 4,839,573 A * | 6/1989 | Wise | 318/615 |
| 4,878,031 A | 10/1989 | Main | 330/254 |
| 4,972,163 A * | 11/1990 | Van Der Plas | 331/12 |
| 5,051,707 A | 9/1991 | Fujita | 330/279 |
| 5,117,201 A | 5/1992 | Luther | 330/279 |
| 5,194,822 A | 3/1993 | Bureau et al. | 330/129 |
| 5,307,026 A | 4/1994 | Mucke | 330/283 |
| 5,459,383 A * | 10/1995 | Sidman et al. | 318/611 |
| 5,592,176 A | 1/1997 | Vickers et al. | |
| 5,668,501 A | 9/1997 | Venes | 330/254 |
| 5,684,431 A | 11/1997 | Gilbert et al. | 330/254 |
| 5,734,974 A | 3/1998 | Callaway, Jr. et al. | 455/234.1 |
| 5,742,206 A | 4/1998 | Ishida | 330/284 |
| 5,774,829 A | 6/1998 | Cisneros et al. | |
| 5,838,395 A | 11/1998 | Brilka | 348/726 |
| 5,867,222 A | 2/1999 | Norris et al. | 348/528 |
| 5,952,880 A | 9/1999 | Voorman et al. | 330/254 |
| 6,018,554 A | 1/2000 | Glover | 375/345 |
| 6,044,253 A | 3/2000 | Tsumura | 455/234.1 |
| 6,107,878 A | 8/2000 | Black | 330/129 |
| 6,111,710 A | 8/2000 | Feyh et al. | 360/46 |
| 6,144,233 A | 11/2000 | Maruyama et al. | 327/77 |
| 6,166,850 A | 12/2000 | Roberts et al. | 359/341 |
| 6,169,452 B1 | 1/2001 | Popescu et al. | 330/254 |
| 6,169,638 B1 | 1/2001 | Morling | 360/46 |
| 6,181,201 B1 | 1/2001 | Black | 330/129 |
| 6,195,028 B1 | 2/2001 | Fredrickson et al. | 341/132 |
| 6,285,863 B1 | 9/2001 | Zhang | |
| 6,563,891 B1 * | 5/2003 | Eriksson et al. | 375/345 |

* cited by examiner

Primary Examiner—Tony T. Nguyen
(74) Attorney, Agent, or Firm—Howard Zaretsky; Zaretsky & Associates PC

(57) ABSTRACT

A novel and useful apparatus for and method of automatic gain control (AGC) using Kalman filtering and hysteresis. A nonlinear, time-variant loop filter such as a Kalman filter is employed in the feedback loop of an AGC circuit. The circuit is able to transition quickly and make fast adaptations to new levels of the input signal by use of a restart mechanism used to dynamically modify the gain of the loop filter thus enabling the AGC circuit to quickly adapt to changes in the signal level of the input. An AGC circuit incorporating a hysteresis circuit in the feedback loop is also disclosed.

56 Claims, 14 Drawing Sheets

DYNAMIC AUTOMATIC GAIN CONTROL CIRCUIT EMPLOYING KALMAN FILTERING

FIELD OF THE INVENTION

The present invention relates generally to communication systems and more particularly relates to an automatic gain control circuit incorporating a Kalman filter in the feedback loop.

BACKGROUND OF THE INVENTION

Automatic Gain Control (AGC) circuits are widely used in numerous applications to automatically adjust the level of an input signal to a desired value. Consider a system wherein an amplifier that is part of an AGC circuit functions to generate an output signal by amplifying an analog input signal. The analog output signal is to be converted to its digital equivalent using an A/D converter. Consider also that the input signal is subject to large power variations such as in the case when the signal is derived from a bursty communication medium. In this case, the goal is to properly determine the gain of the amplifier such that the dynamic range of the A/D converter is best utilized.

A block diagram illustrating a prior art automatic gain control (AGC) circuit is shown in FIG. 1. The AGC circuit, generally referenced 10, comprises a variable gain amplifier 12, A/D converter 14, discriminator 20, summer 18 and loop filter 16. The discriminator 20 functions to calculate the logarithm of the output voltage $v_{out}$. This is common practice in AGC circuits to enhance performance by enabling the circuit to work in the logarithmic, i.e. decibel (dB), domain.

The reference quantity $R_0$ 26 is specified by the requirements of the particular AGC implementation and represents the nominal level of the signal at the AGC output. From the point of view of the loop filter, it shifts the gain by a fixed amount. The reference quantity $R_0$ is subtracted from the output of the discriminator 20 and the difference is input to the loop filter 16. The loop filter functions to generate the gain $g_n$ 22.

The purpose of the AGC circuit is to maintain the signal at the input to the A/D converter at an approximately constant level by controlling the gain of the variable gain amplifier placed before the A/D converter.

Typically, a low pass filter is used in the feedback loop in an AGC circuit to reduce the fluctuations in gain (i.e. to generate an average gain). The characteristics of the low pass filter are typically time invariant. Thus, the low pass filter in the AGC feedback loop can be designed to be either wide or narrow, making the AGC either fast or slow. A slow AGC is an AGC that is narrow in terms of frequency. It is better for continuous transmissions since it performs an average of the signal over a longer period of time, is less sensitive to noise and has less gain ripple. A narrow AGC, however, is characterized by poor tracking in that it has more difficulty following quick changes in the level of input signal.

A fast AGC circuit is an AGC circuit that is wide in terms of frequency. It averages the input signal over a shorter period of time, is more sensitive to noise and has a relatively large ripple in its gain.

On the other hand, in burst type communications, it is desirable to keep the gain fixed during the message. It is also desirable to maintain the gain of the signal between packets at a certain level in order to be able to process it. Thus, the AGC circuit is ideally able to quickly adapt to fast changes in the input.

As is the case with most prior art AGC circuits, the bandwidth of the loop gain is much less than that of the signal itself. Variations in loop gain occur much slower than those in the input signal. Note that if the loop gain were equal to the input signal gain, the output of the AGC circuit would be a flat signal.

In many communication systems, it is desirable that the gain of the AGC not change during reception of the information message and during the noise periods as well. This is because the receiver may learn the noise characteristic between packet transmissions. Therefore, adjustments to the gain should occur only during transients between packets and noise periods. This leads to the following contradictory requirements.

The response of the AGC to low to high transitions of the signal level (i.e. the start of a packet) should be very fast. Thus, the AGC feedback loop should be very fast during the noise periods.

The optimum use of the dynamic range of the A/D converter entails maintaining an approximately constant signal level at the output of the AGC circuit. From the above, however, the gain adjustment should only be made during packet/noise period transitions. The precision of the gain setting is thus affected as a result of the constraint of fast adjustment.

Prior art AGC circuits are configured such that their characteristics are fixed, i.e. the circuit operates as a either fast or slow AGC. This, however, may result in unacceptable performance because the requirements described above cannot be satisfied.

A solution to this problem is to detect the beginning of the packet and upon detection to make the AGC loop fast (i.e. wide in frequency) in order to enable quick acquisition. This is followed by a narrowing of the loop gain in order to enable good tracking.

The problem typically encountered in such a system is how to detect the change in input signal level and to optimally perform the transition from wide to narrow loop filtering.

SUMMARY OF THE INVENTION

Accordingly, the present invention provides a novel and useful apparatus for and method of automatic gain control (AGC) using Kalman filtering. The present invention is suitable for use in a wide range of applications and is particularly useful in controlling the gain of the signal received over wired or wireless channels such as power line based channels.

The feedback loop of the AGC circuit of the present invention comprises a Kalman filter augmented by the addition of a non-linear restart mechanism. The circuit is able to transition quickly and make fast adaptations to new levels of the input. It has been found that a Kalman filter is an optimal way in which to estimate the signal. It provides for fast and accurate adaptations to the level of the input signal. The gain of the Kalman filter controls how fast or slow averaging of the signal is performed. A key feature of the present invention is the mechanism used to set the Kalman gain $K_n$ in an optimal manner. Further, unlike in the prior art, Kalman filtering is used in the present invention in other than the steady state portion of the input signal. Specifically, it is used during acquisition and tracking of the input signal during transient portions of the input.

The input signal is modeled as a stochastic process and the function of the AGC circuit is to try to estimate the level of this signal. The feedback loop comprises a mechanism to detect the level of the signal and use it in generating the gain of the AGC loop.

Three embodiments are presented. The first is an AGC circuit with Kalman filtering which employs a restart mechanism. The restart mechanism enables the AGC circuit to quickly adapt to changes in the signal level of the input. It is used to dynamically modify the gain of the Kalman filter. A restart is triggered when the average of a plurality of previous samples of the AGC output either exceeds an upper threshold or is smaller than a lower threshold. The gain values output by the mechanism can be computed a priori and stored in a table for look up during operation.

It is assumed that the signal power during reception of information packets does not change much as in the case of relatively unchanging channel conditions while the bulk of the gain adjustments occur during transients. The transients are detected by reference to the steady state signal level of the output signal.

A second embodiment comprises an AGC circuit incorporating hysteresis in the feedback loop. The hysteresis circuit is operative to split the loop gain into a feedforward gain and a complementary feedback gain. The hysteresis appears in the feedforward gain only. The feedback gain is used to remove the effects of hysteresis from the AGC output signal before it is fed back to the loop filter, thus making the feedback loop as a whole unaware of the existence of the hysteresis.

A third embodiment comprises an AGC circuit incorporating a combination of Kalman filtering with the restart mechanism and hysteresis. The feedback loop in this AGC circuit is operative to apply hysteresis to the loop gain generated by the Kalman filter. The method of performing hysteresis with restart is described along with an example circuit.

In addition, an embodiment is presented illustrating an application example wherein the AGC circuit of the present invention is used in a communications receiver.

An embodiment is also presented wherein the AGC circuit is implemented in firmware or software for execution on a computing platform. Many aspects of the invention described herein may be constructed as software objects that execute in embedded devices as firmware, software objects that execute as part of a software application on a computer system running an operating system such as Windows, UNIX, LINUX, etc., an Application Specific Integrated Circuit (ASIC), Field Programmable gate Array (FPGA) or functionally equivalent discrete hardware components.

There is thus provided in accordance with the present invention an automatic gain control (AGC) circuit, comprising an amplifier adapted to receive an input signal and to generate an amplified output signal in accordance with a gain control signal, a Kalman filter connected to the amplifier in a feedback loop configuration, the Kalman filter operative to generate a Kalman gain signal in response to the level of the output signal, the Kalman filter comprising a restart mechanism operative to detect sharp transitions in the output signal level and in response thereto, restart the Kalman filter and a control circuit adapted to filter the Kalman gain signal so as to generate the gain control signal.

There is also provided in accordance with the present invention an automatic gain control (AGC) circuit, comprising an amplifier adapted to receive an input signal and to generate an amplified output signal in accordance with an feedforward gain control signal, a loop filter connected to the amplifier in a feedback loop configuration, the loop filter operative to generate a loop gain signal in response to the level of a modified output signal and a hysteresis mechanism operative to apply hysteresis to the loop gain signal and as a result thereof, to generate the feedforward gain control signal and an feedback gain control signal and means for removing the effects of hysteresis generated by the hysteresis mechanism so as to generate the modified output signal.

There is further provided in accordance with the present invention a method of automatic gain control (AGC), the method comprising the steps of amplifying an input signal so as to generate an amplified output signal in accordance with an feedforward gain signal, processing a modified output signal through a Kalman filter located in a feedback loop so as to generate a Kalman gain signal in response to the level of the modified output signal, restarting the Kalman filter in response to the detection of sharp transitions in the output signal level, filtering the Kalman gain signal and generating a loop gain signal in response thereto, applying hysteresis to the loop gain signal and as a result thereof, generating the feedforward gain control signal and an feedback gain control signal and removing the effects of hysteresis from the output signal to generate the modified output signal.

There is also provided in accordance with the present invention a communications receiver for receiving and decoding an M-ary transmitted signal transmitted over a channel having an impulse response $h_i$ comprising a front end circuit for receiving and converting the M-ary transmitted signal to a baseband signal, a demodulator adapted to receive the baseband signal and to generate a received signal therefrom in accordance with the M-ary modulation scheme used to generate the transmitted signal, an automatic gain control (AGC) circuit operative to receive the received signal and to generate an output signal therefrom, the AGC circuit comprising processing means programmed to amplify the received signal so as to generate an amplified output signal in accordance with an feedforward gain signal, process a modified output signal through a Kalman filter located in a feedback loop so as to generate a Kalman gain signal in response to the level of the modified output signal, restart the Kalman filter in response to the detection of sharp transitions in the output signal level, filter the Kalman gain signal and generating a loop gain signal in response thereto, apply hysteresis to the loop gain signal and as a result thereof, generating the feedforward gain control signal and an feedback gain control signal, remove the effects of hysteresis from the output signal to generate the modified output signal, an equalizer operative to receive the received signal and to generate a sequence of soft symbol decisions therefrom, a decoder adapted to receive the soft symbol values and to generate binary received data therefrom and wherein M is a positive integer.

There is still further provided in accordance with the present invention a computer readable storage medium having a computer program embodied thereon for causing a suitably programmed system to automatically control the gain of an input signal by performing the following steps when such program is executed on the system: amplifying the input signal so as to generate an amplified output signal in accordance with an feedforward gain signal, processing a modified output signal through a Kalman filter located in a feedback loop so as to generate a Kalman gain signal in response to the level of the modified output signal, restarting the Kalman filter in response to the detection of sharp transitions in the output signal level, filtering the Kalman gain signal and generating a loop gain signal in response thereto, applying hysteresis to the loop gain signal and as a result thereof, generating the feedforward gain control signal and an feedback gain control signal and removing the effects of hysteresis from the output signal to generate the modified output signal.

BRIEF DESCRIPTION OF THE DRAWINGS

The invention is herein described, by way of example only, with reference to the accompanying drawings, wherein.

Figure 1:
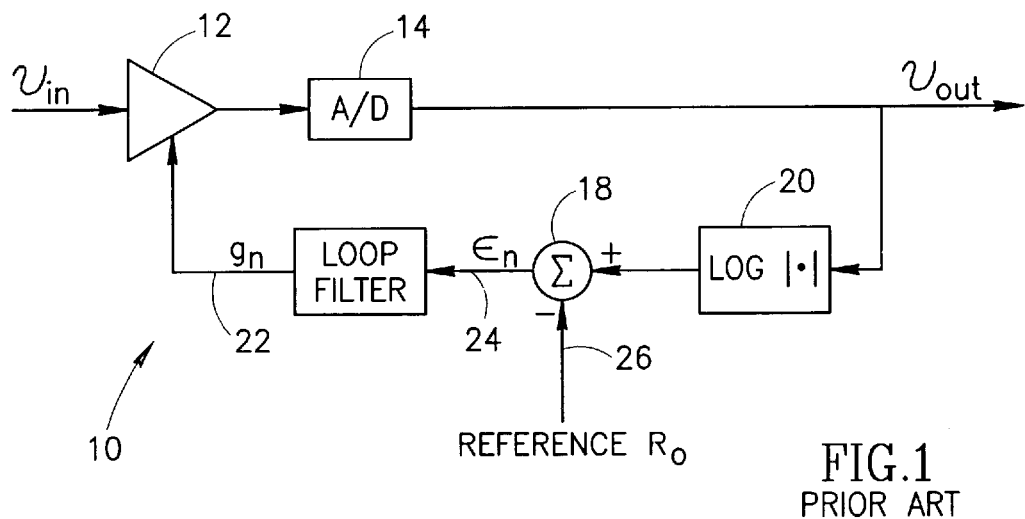
FIG. 1 is a block diagram illustrating a prior art automatic gain control (AGC) circuit.

DETAILED DESCRIPTION OF THE INVENTION
Notation Used Throughout
The following notation is used throughout this document.

| Term | Definition |
| --- | --- |
| AGC | Automatic Gain Control |
| ASIC | Application Specific Integrated Circuit |
| AWGN | Additive White Gaussian Noise |
| BPSK | Binary Phase Shift Keying |
| CPD | Cumulative Probability Distribution |
| CPU | Central Processing Unit |
| CW | Continuous Wave |
| DSP | Digital Signal Processing |
| EEROM | Electrically Erasable Read Only Memory |
| FEC | Forward Error Correction |
| FIFO | First In First Out |
| FPGA | Field Programmable Gate Array |
| IEEE | Institute of Electrical and Electronic Engineers |
| PAM | Pulse Amplitude Modulation |
| PDF | Probability Density Function |
| PN | Pseudo Random |
| QPSK | Quadrature Phase Shift Keying |
| RAM | Random Access Memory |
| ROM | Read Only Memory |
| SNR | Signal to Noise Ratio |
| VA | Viterbi Algorithm |

DETAILED DESCRIPTION OF THE INVENTION

The present invention comprises a novel and useful apparatus for and method of automatic gain control (AGC) using Kalman filtering. The present invention is suitable for use in a wide range of applications and is particularly useful in controlling the gain of the signal received over wired or wireless channels including power line based channels.

In one embodiment, the feedback loop of the AGC circuit of the present invention comprises a Kalman filter. The circuit is able to transition quickly and make fast adaptations to new levels of the input signal. It has been found that a Kalman filter is an optimal way in which to estimate the input signal. It provides for fast and accurate adaptations to the level of the input signal. The gain of the Kalman filter controls how fast or slow averaging of the signal is performed. A key feature of the present invention is the mechanism used to set the Kalman gain $K_n$ in an optimal manner.

For illustration purposes, the invention is described in the context of a packet based communications system. Note, however, that it is not intended that the invention be limited to the example presented herein. It is appreciated that one skilled in the art can apply the principles of the invention to other types of communications systems as well.

It is thus assumed that the information-bearing signal comprises strings of information packets arriving over a channel such as the power line channel. The packets may arrive from one or more other devices either contiguously or sporadically and may have differing average power levels. For the duration of a packet, the nature of the channel may be considered to be linear and time-invariant. Therefore, significant changes in the power of the information signal are not expected during the reception of packets. The disturbances to the channel are assumed to be a mixture of colored Gaussian noise and man-made interferences such as spikes, etc. In addition, the noise level is expected to be slowly changing except for occasional impulse noise interference.

For purposes of this specification, the meaning of the term 'signal level' depends on the nature of the signal, e.g., C W, random noise, PAM, etc. The signal level may be defined as the signal power, signal magnitude or the result of some nonlinear process applied to the signal such as rectification, etc. Typically, however, it is convenient to define signal level to be the envelope of the signal magnitude, i.e. its absolute value.

Figure 2:
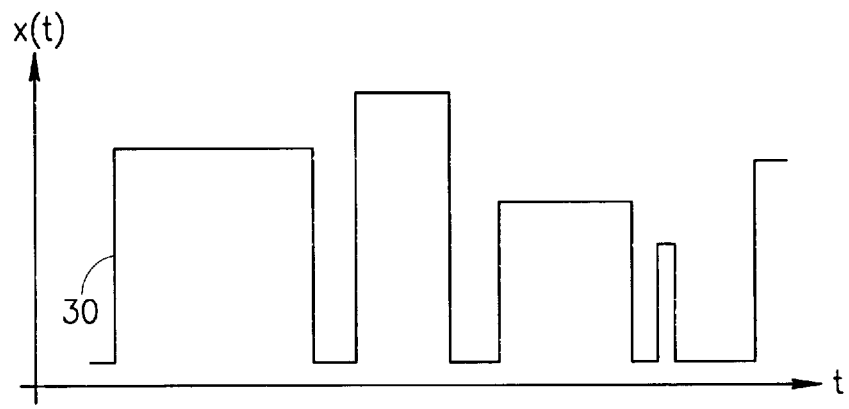
FIG. 2 is a diagram illustrating an example input signal representing a stochastic process to be estimated by the AGC circuit.

The present invention views the AGC problems discussed in the Background Section as that of an on-line estimation of an artificial stochastic process which may be called a 'signal level process.' A diagram illustrating an example input signal representing a stochastic process to be estimated by the AGC circuit is shown in FIG. 2. Such a process could evolve over time as shown by the signal 30. Here the low level represents the noise floor of the channel while the high level portions represent packets arriving from various different sources or represent bursts of high-powered noise.

In this scenario, the observation of the stochastic process involves measurement noise which is the information signal itself during packet reception and channel noise during the periods of time between packets.

The present invention provides a solution using this approach to the problem by applying the well-known Kalman filter, to the feedback loop of the AGC circuit.

Formalism of Kalman Filtering

To aid in understanding the principles of the present invention, a brief review of the formalism of the Kalman filter is presented. Suppose a discrete-time process $x_n$ can be described by the following state-space model $$x_{n+1} = ax_n + b\xi_n$$
$$y_n = A'x_n + \eta w_n \quad (1)$$

where a, b and A are matrices of suitable dimensions;

$x_n$ is a state vector;

$w_n$ represents measurement noise assumed to Gaussian, white and of unit variance;

$\xi_n$ represents process noise assumed to Gaussian, white and of unit variance;

Note that in this formulation, the signal model is time invariant. The following formulation of the Kalman filter emphasizes its predictor-corrector operation.

$$\hat{x}_{n|n} = \hat{x}_{n|n-1} + K_n(y_n - A'\hat{x}_{n|n-1})$$
$$\hat{x}_{n+1|n} = a\hat{x}_{n|n} \quad (2)$$

with some initial condition $$\hat{x}_{0|-1} = x_0 \quad (3)$$

where $\hat{x}_{n|n-1}$ denotes the state estimate before measurement;

$\hat{x}_{n|n}$ is the estimate corrected by the measurement $y_n$;

As seen from Equation 2, $\hat{x}_{n|n-1}$ is predicted from $\hat{x}_{n-1|n-1}$ through the state transition matrix a. Note that the estimates $\hat{x}_{n|n-1}$ and $\hat{x}_{n|n}$ are also Gaussian random vectors. Their covariance matrices $P_{n|n-1}$ and $P_{n|n}$ respectively, are determined together with the Kalman gain vector $K_n$ by the following recursive computation.

$$K_n = P_{n|n-1}A/(A'P_{n|n-1}A + \eta^2)$$
$$P_{n|n-1} = aP_{n-1}a' + bb'$$
$$P_n = (1 - K_n A')P_{n|n-1} \quad (4)$$

with initial condition $$P_{0|-1} = P_0$$

Note that the initial conditions have no effect on the steady state Kalman gain K. On the other hand, given the initial $P_0$, the Kalman gain vector sequence may be precomputed for all n.

AGC Circuit with Kalman Filter

Figure 3:
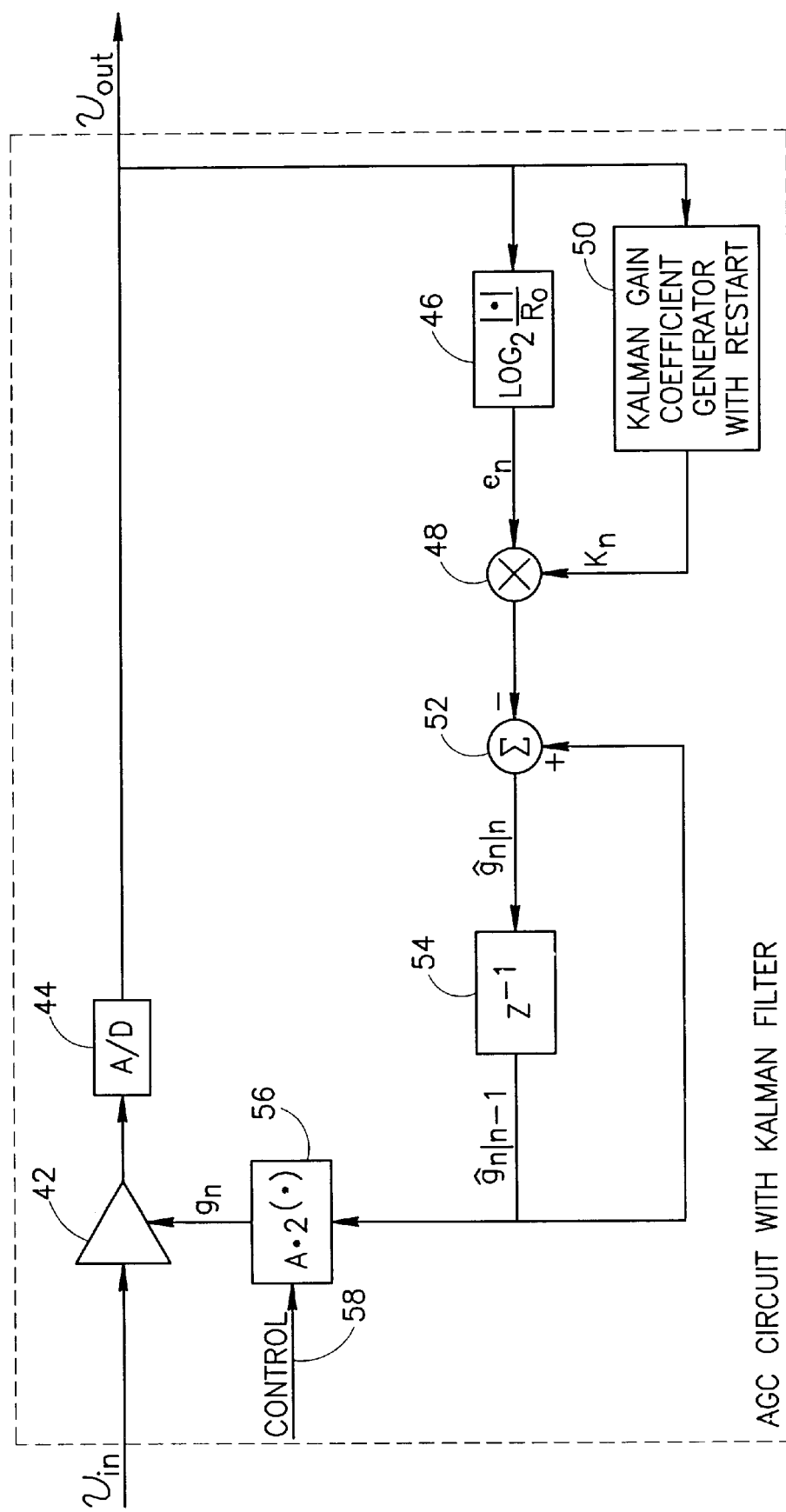
FIG. 3 is a block diagram illustrating a first embodiment of an AGC circuit employing Kalman filtering constructed in accordance with the present invention.

A block diagram illustrating a first embodiment of an AGC circuit employing Kalman filtering constructed in accordance with the present invention is shown in FIG. 3. The AGC circuit, generally referenced 40, comprises a variable gain amplifier 42, A/D converter 44, discriminator 46, Kalman gain coefficient generator with restart 50, correction multiplier 48, summer 52, delay 54 and inverse logarithm function 56.

The AGC feedback loop is constructed such that the AGC gain plays an explicit role as the state variable. Note that all the signals, except for the input and output voltage, $V_{in}$ and $V_{out}$, are expressed on the logarithmic scale. The time indices of the various signals describe the situation just before the $n+1^{th}$ clock.

The amplifier 42 may comprise any type of amplifier having suitable drive capability and is not limited to a variable gain type. For example, a variable gain amplifier is not required in the second embodiment described infra since the gain is changed in quantized steps wherein the step size is chosen in accordance with the particular implementation (e.g., 6 dB/step).

The control signal 58 to block 56 is optional and comprises information from the receiver that the AGC is now operating within a packet. This information can be used to optionally freeze the gain while receiving within a packet.

The reference quantity $R_0$ is specified by the requirements of the particular AGC implementation and represents the nominal level of the signal at the AGC output. From the point of view of the Kalman filter, it shifts the estimate by a fixed amount. The reference quantity $R_0$ is factored into the conversion of the binary output signal into a logarithmic representation.

In order to meet the contradictory requirements described in the Background section, the feedback loop of the AGC circuit comprises an estimator which functions to accurately track both the transients between levels and the levels themselves (see the example stochastic function in FIG. 2). It is commonly accepted that a first order Kalman filter is optimal for estimating a constant level. It is not optimal, however, for tracking sharp transitions.

As a solution to this, the feedback loop of the AGC circuit of the present invention incorporates a restart mechanism as described infra. The Kalman filter serves as an estimator of a random, constant-level signal which occasionally undergoes sharps transitions. It is desirable to follow these transitions as quickly as possible, without actually tracking them, i.e. the detailed form of the transition is not of interest, only the signal level.

Thus, the Kalman filter constructed employs a first order Kalman filter during periods wherein the level of the signal is constant. It also comprises a mechanism for detecting occurrences of sharp level transitions. Upon detection of such a transition, the Kalman filter is restarted by imposing an initial state $x_{0|-1}$ and $P_{0|-1}$ and proceeding with calculations from that point.

The restart block 50 is operative to generate the correct values of Kalman gain and for detecting transitions in the signal. Thus, the Kalman filter employed is a nonlinear, time invariant filter, possessing certain optimality properties The appropriate signal model for periods between transitions is as follows $$x_{n+1} = x_n$$
$$y_n = x_n + \eta w_n \quad (5)$$

where the first equation describes a constant sequence. Note that although the Kalman filter model describes a stationary process $\{x_n\}$, the resulting Kalman filter is not asymptotically stable because it is not controllable. To make it stable, it is preferable that a small amount of 'process noise' be present in the signal model. Using the corrected signal model $$x_{n+1} = x_n + q\xi_n$$

$$y_n = x_n + \eta w_n \qquad (6)$$

we obtain the estimate $$\hat{x}_{n|n} = \hat{x}_{n|n-1} + K_n(y_n - \hat{x}_{n|n-1})$$

$$\hat{x}_{n+1|n} = \hat{x}_{n|n} \qquad (7)$$

with some initial condition $$\hat{x}_{0|-1} = \hat{x}_0$$

The Kalman gain is computed using the following iterations $$K_n = P_{n|n-1}/(P_{n|n-1} + \eta^2)$$

$$P_{n|n-1} = P_{n-1|n-1} + q^2$$

$$P_{n|n} = (1 - K_n)P_{n|n-1} \qquad (8)$$

with an initial condition $$P_{0|-1} = P_0$$

which expresses the lack of knowledge of the initial state $\hat{x}_0$. In accordance with the invention, the sequence $\{K_n, n=0, 1, \ldots\}$ may be precomputed. The method of choosing the design parameters q, $\eta$, $\hat{x}_0$ and $P_0$ is described below.

It has been found that the level of measurement noise $\eta$ does not depend on the input level itself and depends only slightly on the characteristics of the signal. It depends only on the bandwidth of the signal. This is an effect of processing in the logarithmic domain. For example, with input filter band limiting the input to a frequency range of 4–20 MHz, the power of observation noise appearing at the output of the $\log_2$ block 46 for signals of various characteristics was consistently measured at $\eta=1.6$ The parameter q determines the ability of the Kalman filter to track changes in input level. Stated alternatively, it determines the accuracy of the estimation of a constant level in steady state. Consider, for example, that the signal input to the AGC circuit has constant average power. The Kalman filter is operative to estimate the signal level to any given precision. The precision of estimation is expressed as $P_{n|n-1}$, which is the means square error of the estimate. Using Equation 8, this parameter is determined by the initial value $P_0$, measurement noise level $\eta$ and by q.

The asymptotic values (n→∞) are denoted $$K_n \to K$$

$$P_{n|n-1} \to Q$$

Using Equation 8, we derive $$K = \frac{Q}{Q + \eta^2}$$

$$Q = (1 - K)Q + q^2$$

By straightforward manipulation we arrive at $$Q = \frac{1}{2}q(q + \sqrt{q^2 + 4\eta^2}) \qquad (9)$$

Given the required estimation precision Q, the required q can be computed.

The parameter $P_0$ is the initial variance of the predictor and is set anew upon each restart. It may be estimated from the expected jump in gain it is desired to be tracked.

The initial value (upon restart) of the gain estimate $\hat{x}_{0|-1}$ is determined by setting it equal to the last value of the predictor just prior to the restart. Note that in alternative embodiments, this parameter may be chosen in other appropriate ways.

The parameter $R_0$ functions to prevent saturation of the A/D converter. Note that the loop in the AGC circuit 40 tries to cancel the error $$\epsilon_n = \log_2 \frac{|v_n|}{R_0}$$

Therefore, $R_0$ controls the signal level at the input to the A/D converter. Note that a signal at the input to the A/D converter is at a nominal level when the dynamic range of the A/D converter is utilized to the fullest without driving it into saturation.

In practice, however, a slightly more relaxed requirement of preventing A/D saturation only 99% of the time is applied. Thus, $R_0$ is determined so that $$\text{Prob}\{v_{out}| > \text{Full scale}\} \leq 0.001$$

where 'Full scale' refers to the saturation level of the A/D converter. This is performed as follows.

Step 1: Analyze the characteristics of the input signal $\{v_{in}\}$. The signal has arbitrary but constant power. Find a level $d_0$ such that $$\int_0^{d_0} f_{|v|}(t) \, dt = 0.99$$

where $f_{|v|}(v)$ is the probability density function (PDF) of $\{|v_{in}|\}$. In addition, calculate the mean $$d_1 = E[\log_2 |v_{in}|]$$

Step 2: Assume that the AGC performs as required, i.e. the gain G of the amplifier is such that $$G \cdot d_0 = \text{Full scale} \Rightarrow G = \frac{\text{Full scale}}{d_0}$$

Then $$E[\log_2 |Gx_k|] = E[\log_2 |x_k|] + \log_2 G$$

$$= d_1 + \log_2 \frac{\text{Full scale}}{d_0}$$

which is by definition the nominal signal level. Hence $$\log_2 R_0 = d_1 + \log_2 \frac{\text{Full scale}}{d_0} \quad \text{or} \quad R_0 = \frac{\text{Full scale}}{d_0} \cdot 2^{d_1}$$

Detection of Transitions in Signal Power Level

In accordance with the model of behavior of the signals in the communication channel, the information is transmitted in packets with intermittent periods of noise between packets. It is noted that during both these periods, the average signal power is approximately constant.

As described supra the invention incorporates a restart mechanism in the feedback loop of the AGC circuit. The premise for the operation of the restart mechanism is as follows. Assume that after some time period after the start of a packet, the AGC has stabilized and the signal at the output has achieved a nominal power level. At the end of a packet, the power at the input to the AGC circuit drops sharply, and a drop of the same amount is experienced at the output of the AGC circuit. Further, the characteristic of the Kalman filter employed in the feedback loop is such that the AGC gain at this point in time changes relatively slowly. Consequently, the output signal will remain off from the nominal level for a relatively long time. This time period may be used to test for a change in the output signal power level. The invention thus employs a statistical hypothesis test procedure based on the well-known Neymann-Pearson lemma.

The statistical hypothesis test functions to detect the power drop at the end of the packet. To achieve this, the signal is analyzed to decide between one of two hypotheses.

$$H_0 : E[v_n^2] = \sigma_0^2 \tag{10}$$

against $$H_1 : E[v_n^2] \leq \sigma_1^2 \tag{11}$$

where $\sigma_0^2$ is the nominal signal power at the output of the AGC and $\sigma_1^2$ is the signal power after the drop occurred, $\sigma_1^2 < \sigma_0^2$.

For simplicity, it is assumed that the signal $v_n$ has a Gaussian distribution and that the test is based on N successive observations (i.e. N signal samples). Further, it is assumed that the measurements are independent of each other. Then, it may be shown that the sufficient statistics for the test is $$s_n = \sum_{k=n}^{n+N-1} v_k^2 \tag{12}$$

The test is considered successful in that it decides for hypothesis $H_1$ (i.e. the power drop occurred) when the following inequality holds:

$$s_n \leq \sigma_0^2 \Phi_N^{-1}(P_{FA}) \tag{13}$$

wherein $\Phi_N(t)$ denotes the Cumulative Probability Distribution (CPD) of $x_N^2$, a chi-square random variable with N degrees of freedom, and $P_{FA}$ represents the probability of false alarm which is the prescribed probability that the test will succeed when in fact no power drop occurs.

The case of upward change of the input power may be treated in a similar manner. Here, the two hypotheses are $$H_0 : E[v_n^2] = \sigma_0^2 \tag{14}$$

against $$H'_1 : E[v_n^2] \geq \sigma_2^2 \tag{15}$$

with $\sigma_2^2 > \sigma_0^2$. Using the same statistics $s_n$ as expressed in Equation 12 are used, except that the inequality checked is given by $$s_n \geq \sigma_0^2 \Phi_N^{-1}(1-P_{FA}) \tag{16}$$

Thus, the detection of a change in power comprises the testing of hypothesis $H_0$ against $H_1$ and then $H_0$ against $H'_1$.

Figure 4:
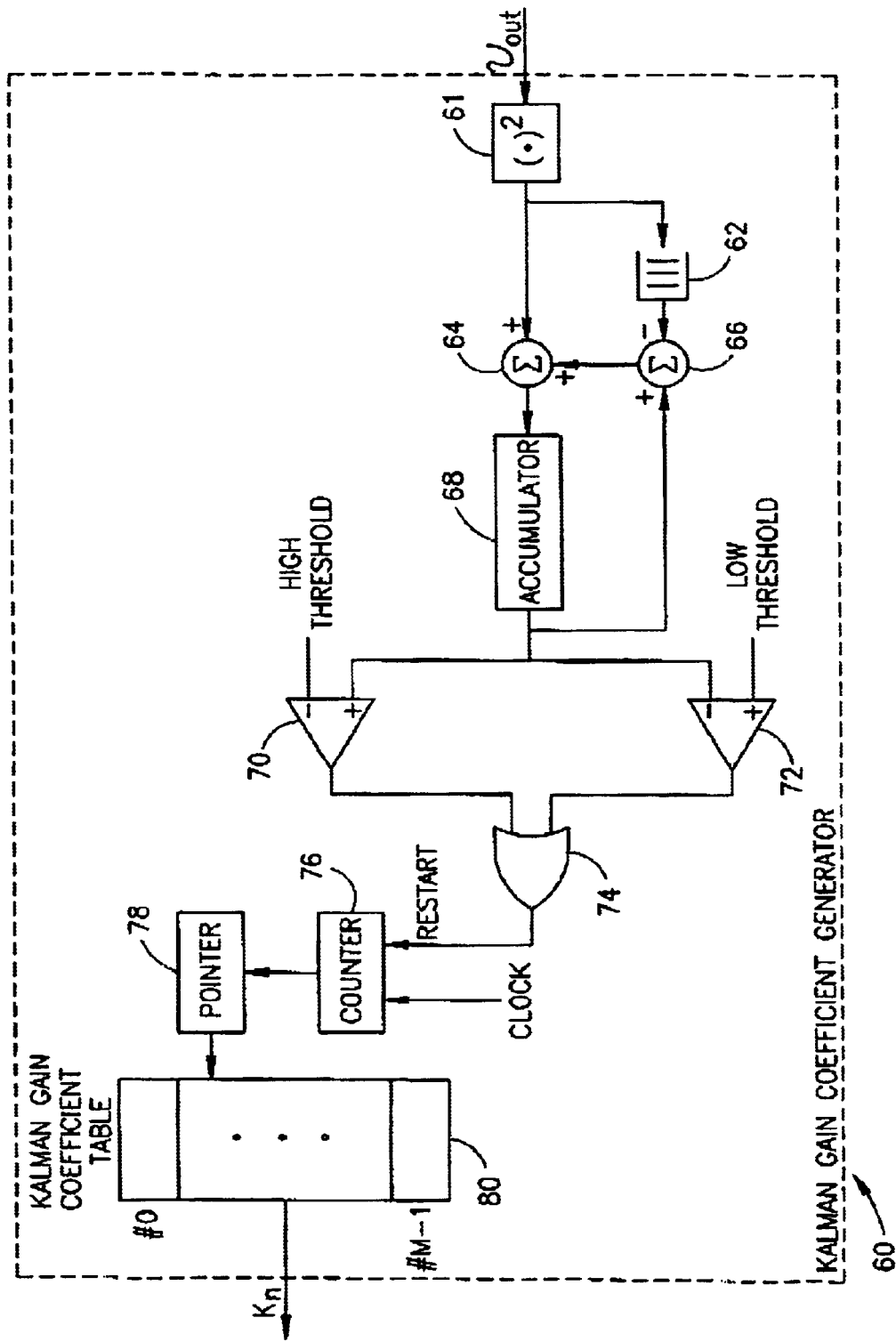
FIG. 4 is a block diagram illustrating the signal power level test procedure and Kalman gain generator of FIG. 3 in more detail.

A block diagram illustrating the signal power level test procedure and Kalman gain generator of FIG. 3 in more detail is shown in FIG. 4. The generator, generally referenced 60, comprises a squarer 61, FIFO 62, summers 64, 66, accumulator 68, comparators 70, 72, OR gate 74, counter 76, pointer register 78 and gain coefficient table 80.

The generator is initialized by clearing the FIFO and the accumulator. In operation, the samples output of the AGC circuit are first squared and input to a FIFO storage having a plurality of cells, e.g., a few tens of cells, and summer 64. The accumulator 68, in combination with the adders and FIFO, functions to maintain a moving sum of the past values stored in the FIFO. Once the FIFO is full, as a new sample is received, the last sample is shifted out and subtracted from the accumulator result. Note that the samples arrive at the generator at the symbol rate. Note also that the test requires that the samples of the tested signal be statistically independent.

If the FIFO is full, the accumulator value is compared against two predetermined thresholds, an upper threshold and a lower threshold. The accumulator value is compared to the upper threshold via comparator 70 and to the lower threshold via comparator 72. If the accumulator value exceeds the upper threshold or is smaller than the lower threshold, the test is successful and a RESTART signal is generated by OR gate 74. The test fails otherwise.

If the test is successful, the accumulator and FIFO are cleared and the process begins anew. If, the test fails, the process continues to input and process new samples as described above.

As described supra, the Kalman gain coefficients may be computed beforehand and stored in a table 80. The table is adapted to hold M coefficients, wherein in one example, M may be 20. The output of a counter 76 driven by a sample clock is used as a pointer into the gain coefficient table 80. The pointer indicates which coefficient will be output at the next clock. Each clock, another coefficient is read out of the table until the last coefficient which, once reached, is repeatedly read out.

Upon the triggering of a restart, the counter 76 is reset and the Kalman gain coefficients stored in the beginning of the table are read out, i.e. coefficient #0, #1, etc., and the count continues through the M-1 coefficients stored in the table. Thus, to output the correct gain, it is sufficient to reset the counter (i.e. the pointer) to the first location in the table each time the test is successful, i.e. a restart is triggered, or upon first time initialization. Otherwise, the clock increments the counter and the pointer increases with each clock.

The above described signal power level test has limitations which will now be described. The Neymann-Pearson test procedure uses the concept of 'probability of false alarm,' wherein the event termed 'false alarm' denotes success of the test when in fact no power transition has taken place. A false alarm in an AGC circuit may cause a short but violent transient effect, similar to a spike in the input signal. If it occurs during the reception of a packet, it may cause the occurrence of a burst of errors. It is hard, however, to avoid false alarms. Their probability can be decreased at the price of compromising overall performance, which may translate to one or all of the following:

1. Decreasing the detection probability. This is the reason why the false alarm probability cannot decreased down to zero since then the probability of detection would also become zero.
2. Compromising the possibility of detection of small jumps in power.
3. Enlarging the number of samples required for the test. This is equivalent to a longer time duration for execution of the test.

Further, to prevent adverse effects of a small detection probability, it may be necessary to increase the value of the parameter q of the Kalman filter. Assuming that a transition was not detected and consequently, the circuit then relies on the natural ability of the Kalman filter to acquire the new signal level without the benefit of the restart mechanism. For this to happen within a reasonably short time frame, the value of the parameter q cannot be set too small.

The following implementation example of an AGC is presented to illustrate the operation of the present invention. The assumed environment is simulated as follows. Information bearing signal comprising 16 Msymbols/sec symbol rate, BPSK modulation in the band ranging from 4 to 20 MHz. The received data is organized in packets having a duration of 100 μsec with pauses in transmission between packets. The channel is flat with AWGN channel and an SNR of 10 dB. The input passband filter spans a frequency range of 3 to 21 MHz.

The AGC circuit samples the signal at a rate of 64 Msamples/sec and the A/D converter has an 8-bit resolution. The AGC provides detection of the start and end of a packet within 1 μsec. Gain fluctuations are smaller than +/−0.5 dB.

With reference to the selection of Kalman filter parameters described supra, parameter q is chosen using Equation 9. It is desired to limit the gain fluctuation to a range of +/−0.5 dB. Assuming a Gaussian distribution of the estimation error, the standard deviation of the gain fluctuation is approximately one third of this quantity, i.e.

$$\sqrt{Q} \leq \frac{1}{3}\log_2 10^{0.5/20} = 0.0277$$

or $Q \cong 7.66 \times 10^{-4}$. Recalling that $\eta=1.6$, it follows that $q<<\eta$. Hence, Equation 9 can be simplified to $$Q \cong q\eta$$

and $$q \cong Q/\eta \cong 4.79 \cdot 10^{-4} \quad (17)$$

Assume the expected change of gain desired to be tracked is 20 dB. The initial uncertainty in gain estimate $P_0$ is then $$P_0 \sim (\log_2 10^{20/20})^2 = 11$$

In accordance with the description of the choice for parameter $R_0$, the nominal level was determined experimentally to be $$R_0 = 26$$

which is 13.7 dB less than the saturation level of the 8-bit A/D converter. Note that this should not be confused with the mean power of the signal at the output of the AGC circuit, which is computed independently.

The selection of parameters for the restart circuit is as follows. Given the sample rate of 64 MHz and symbol rate of 16 Msymbols/sec, the test for signal power level is chosen to be performed every fourth sample. The thresholds and the depth of the FIFO are determined from the requirement that the start and end of packets be detected within 1 μsec.

Figure 5A:
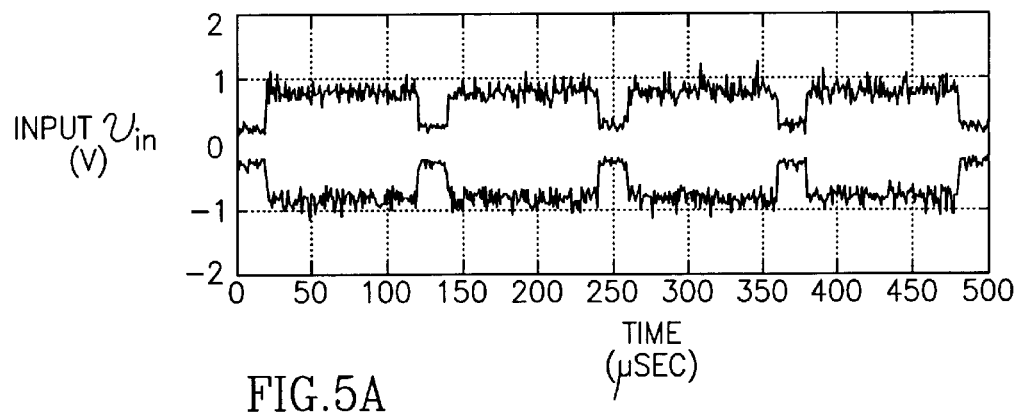
FIGS. 5A, 5B and 5C are signal diagrams illustrating the performance of the first embodiment AGC circuit.
Figure 5B:
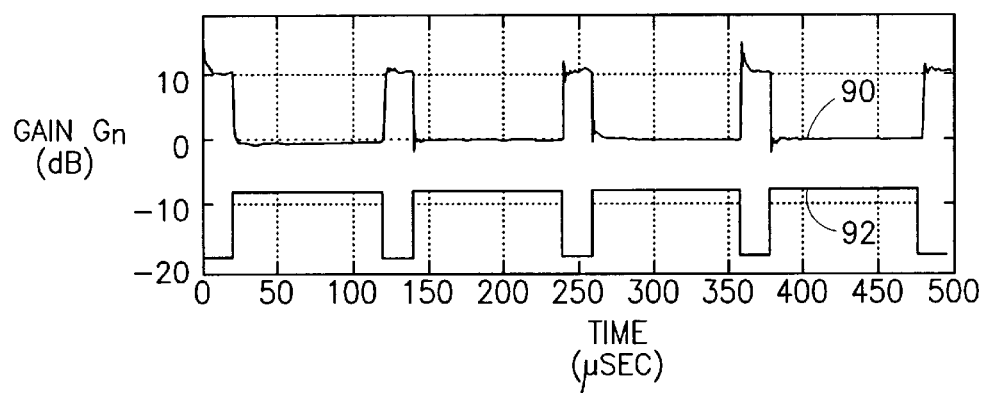
Figure 5C:
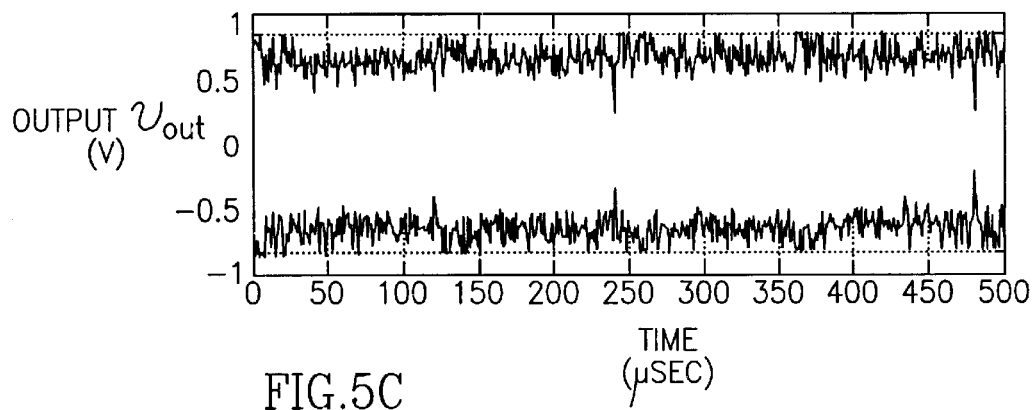
Figure 6A:
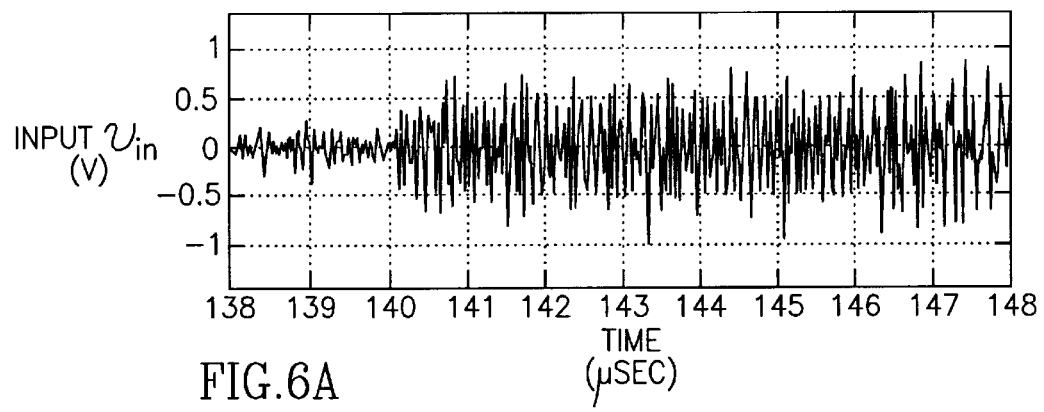
FIGS. 6A, 6B and 6C are signal diagrams illustrating the performance of the first embodiment AGC circuit in more detail.
Figure 6B:
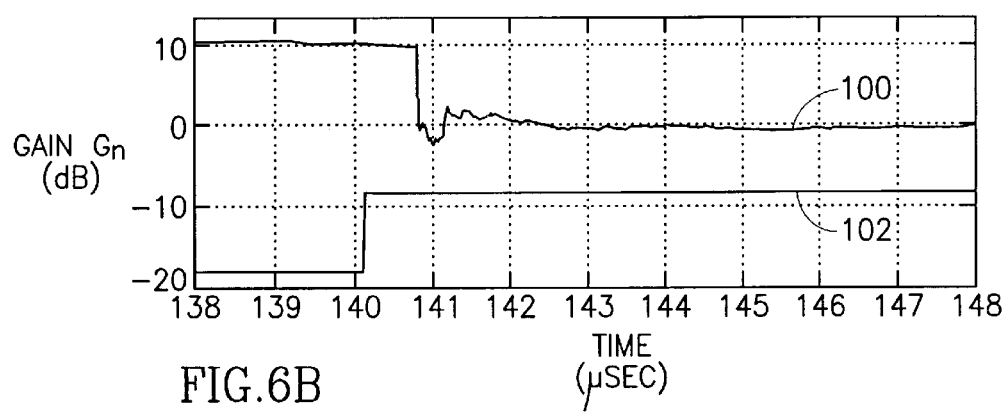
Figure 6C:
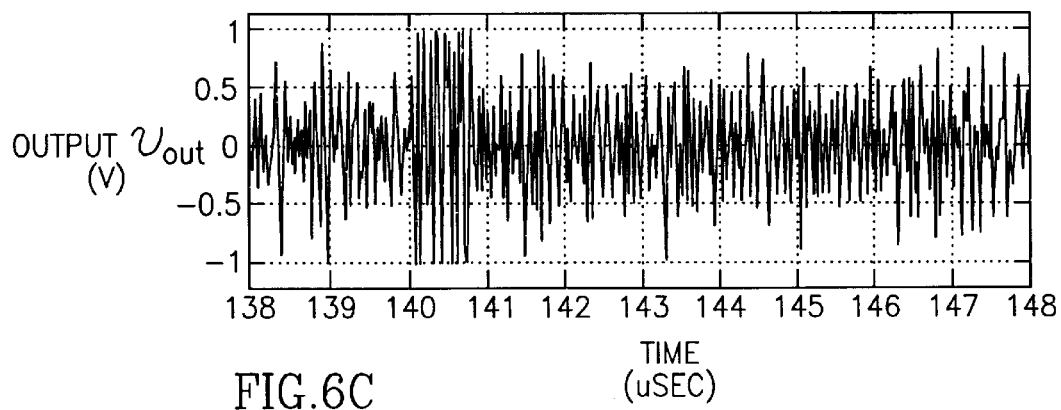

FIGS. 5A, 5B and 5C are signal diagrams illustrating the performance of the AGC circuit of the first embodiment of the present invention. FIGS. 6A, 6B and 6C are signal diagrams illustrating in more detail a portion of the traces shown in FIGS. 5A, 5B and 5C, respectively.

FIGS. 5A and 6A show the input signal voltage $V_{in}$ to the AGC circuit. FIGS. 5B and 6B each show two traces: traces 90, 100 are the AGC gain control signals generated by the feedback loop and traces 92 are the true or ideal signal levels. FIGS. 5C and 6C show the resulting output signal voltage $v_{out}$ from the AGC circuit.

It is noted that the time delay from the occurrence of the sharp transition in the input signal to the lowering of the gain is approximately a 0.5 μsec. This is the delay incurred in the detection of the power signal level test within the restart mechanism. Moreover, the abrupt change in gain in response to the restart mechanism is followed by relatively little ripple.

AGC Circuit with Hysteresis

As described hereinabove, the purpose of an AGC circuit is to maintain the output signal at some nominal level regardless of the level of the input signal. Assuming that the input signal has a constant power, the operation of a closed feedback loop (see FIG. 3) necessarily requires continuous updating of the controlled variable, i.e. the Kalman gain $g_n$. Consequently, the ratio $V_{out}/V_{in}$, is affected by fluctuations in the input signal and cannot be kept constant. In order to improve the input/output characteristic of the AGC circuit, the present invention employs hysteresis in the feedback loop. It is noted that the addition of hysteresis has no negative effect on the performance of the loop while providing the benefit of removing the gain fluctuations from the circuit.

Figure 7:
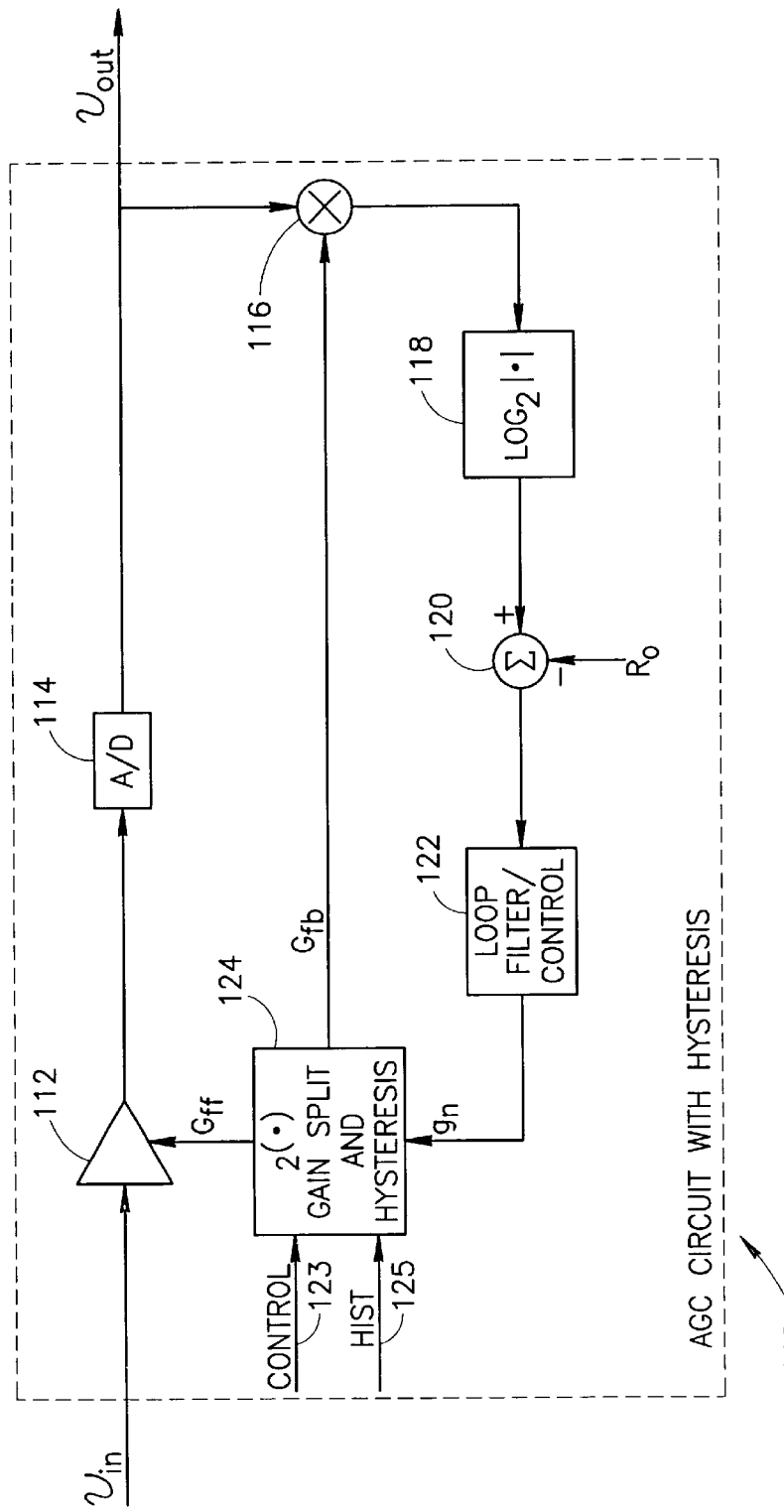
FIG. 7 is a block diagram illustrating a second embodiment of an AGC circuit employing hysteresis constructed in accordance with the present invention.

A block diagram illustrating a second embodiment of an AGC circuit employing hysteresis constructed in accordance with the present invention is shown in FIG. 7. In the first embodiment described supra, a problem may arise in the operation of the feedback loop that implements the Kalman estimator. More specifically, a problem may arise due to the continuously changing the gain of the loop in response to the fluctuations of the input. To prevent adverse effects of such gain fluctuations on the output signal, the second embodiment of the present invention inserts hysteresis only in the relationship between input and output while keeping the feedback loop hysteresis free.

The AGC circuit with hysteresis, generally referenced 110, is adapted to suppress fluctuations in AGC gain within some range around its steady state value. Such fluctuations can be seen in trace 100 FIG. 6B, especially during the first 2 μsec after restart.

The circuit comprises an amplifier 112, A/D converter 114, a multiplier 116, a logarithmic block 118, adder 120, loop filter/control block 122, gain splitter and hysteresis block 124. In accordance with the present invention, the gain block is split into two portions. The gain block 124 generates two gain control signals: a feedforward gain control signal denoted $G_{ff}$ and a feedback gain control signal denoted $G_{fb}$. In the first gain stage, the feedforward gain control signal $G_{ff}$ sets the gain on the feedforward amplifier 112. The second gain stage comprises the multiplier 116 which functions as a feedback amplifier and generates the product of the output signal $v_{out}$ and the feedback gain control signal $G_{fb}$. This second gain stage serves to nullify the effect of hysteresis in the first stage, thus keeping the feedback loop free of hysteresis.

The Control signal 123 input to block 124 is optional and comprises information, such as in the form of a command, from the receiver that the AGC is now operating within a packet. This information can be used to optionally inhibit gain updates while receiving within a packet. The Hist signal 125 controls the range of change in feedforward gain as described hereinbelow.

In accordance with one example embodiment of the invention, the loop gain variable $g_n$ is chosen to be subjected to hysteresis. It is appreciated that other configurations are possible as contemplated by the invention, for example, an application in which a moving average of the gain is subjected to hysteresis. It is also appreciated that the invention is not limited to the embodiment whereby only the gain is subject to hysteresis, as the invention contemplates subjecting other quantities to hysteresis as well. The term nominal AGC gain is defined as the gain which, for a given input level, insures that the output from the AGC circuit is the nominal output level. Then, as long as $g_n$ remains within a certain vicinity of the nominal gain, the hysteresis circuit maintains the feedforward gain $G_{ff}$ fixed. This can be expressed by the following algorithm, which is executed every clock cycle.

Step 1: If the AGC gain $g_n$ resides within the range $$g_n \in [G_0 - \text{Hist}/2, G_0 + \text{Hist}/2]$$

where $G_0$ denotes the nominal gain, hold the feedforward gain $G_{ff}$ fixed at its last value.

Step 2: If at some moment $$g_n < G_0 - \text{Hist}/2 \text{ or } g_n > G_0 + \text{Hist}/2,$$

change the feedforward gain to $$G_{ff} \eta 2^{g_n}$$

Step 3: In any case, (i.e. whether the change in step 2 took place or not) update the feedback gain $G_{fb}$ by $$G_{fb} = 2^{g_n}/G_{ff}$$

Note that although the hysteresis circuit by itself does not improve the quality of estimation, it may prevent unnecessary variations in the gain of the amplifier. The price for this is a slightly reduced dynamic range of the A/D converter since the circuit is preferably designed for the worst-case uncertainty of the nominal gain.

The feedforward gain control signal sets the gain of the feedforward amplifier while the feedback gain control signal sets the gain of the amplifier (i.e. multiplier) in the feedback portion of the hysteresis loop. Note that without the feedback gain, the hysteresis loop would not be properly closed. Therefore, the feedback gain functions to close the loop. In operation of the hysteresis loop, the feedforward gain does not change with small changes in the AGC loop gain variable (i.e., when the input signal level does not change appreciably). Once the AGC loop gain exceeds the range set by the Hist signal, the feedforward gain is changed. Note that the gain range can be centered on any arbitrary gain value and is not restricted to certain gain values. The range is always determined from a +/− deviation from the last set value.

In practice, the loop variable subjected to hysteresis is the running average of the logarithmic gain $g_{n|n-1}$.

$$g_{av}(n) = \frac{1}{N} \sum_{k=n-N+1}^{n} \hat{g}_{k|k-1} \quad (18)$$

where N, the FIFO depth, is determined in accordance with the amount of hysteresis Hist. The FIFO comprises the memory used to compute the running average. The method of determining N is described hereinbelow.

Figure 8:
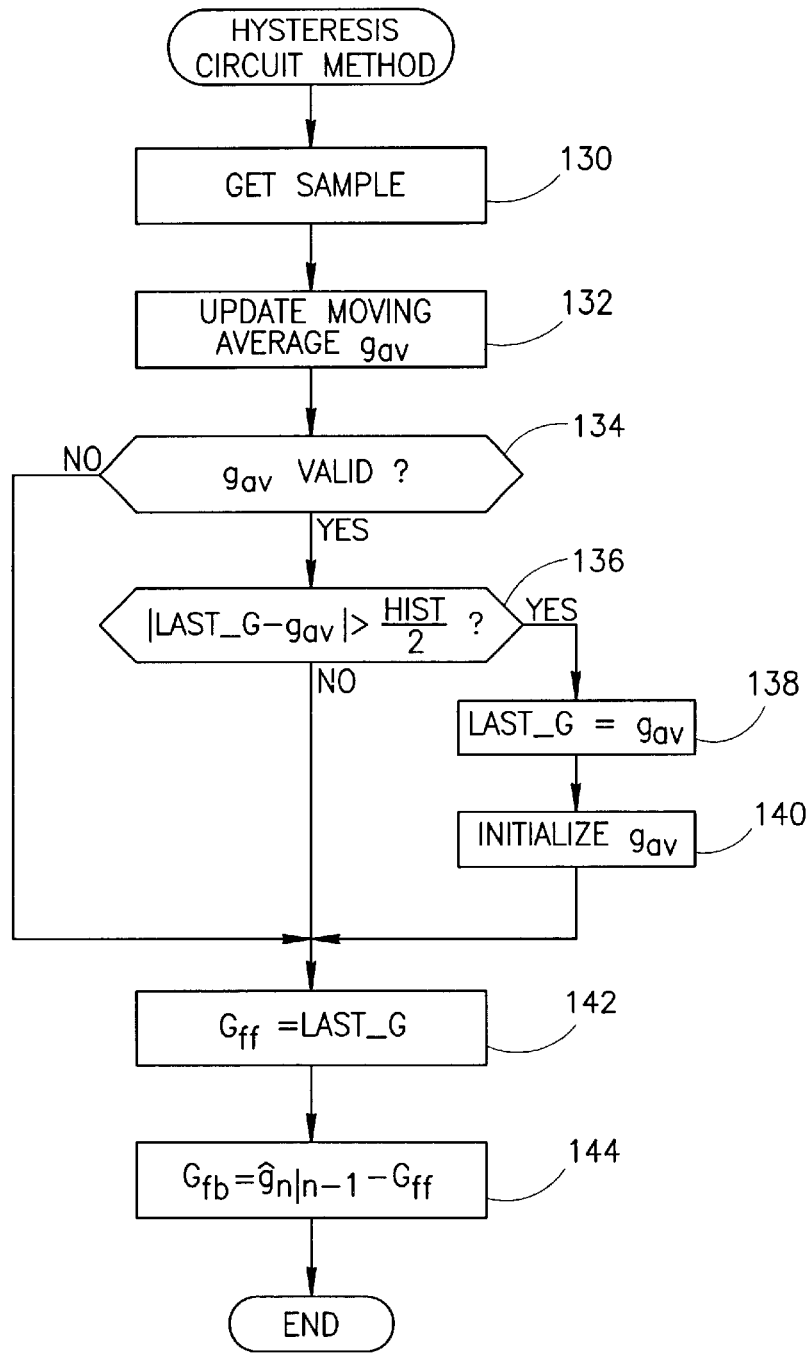
FIG. 8 is a flow diagram illustrating the hysteresis method of the AGC circuit of FIG. 8.

A flow diagram illustrating the hysteresis method of the AGC circuit of FIG. 7 is shown in FIG. 8. The variable last_G denotes the value of the feedforward gain set during the last update cycle. The various operations mentioned in the flowchart are defined as follows:

1. init $g_{av}$: clear the FIFO;
2. update $g_{av}$: push the new gain $\hat{g}_{n|n-1}$ onto the FIFO;
3. valid $g_{av}$: if the FIFO is full compute the following $$g_{av}(n) = \frac{1}{N} \sum_{k=n-N+1}^{n} \hat{g}_{k|k-1}$$

and $g_{av}$ is deemed valid. If the FIFO is not yet full, $g_{av}$ is invalid.

Note that initially, no hysteresis is performed until the FIFO fills and an average can be obtained. Note also, that all gains are expressed in logarithmic scale. The first step is to obtain a sample (step 130). The moving average $g_{av}$ of N samples is then updated (step 132). Then, it is checked whether $g_{av}$ is valid (step 134). If it is valid (i.e. the FIFO is full), it is checked whether the feedforward gain needs to be changed (step 136).

$$|\text{last\_}G - g_{av}| > \text{Hist}/2$$

If the feedforward gain is to be changed, last_G is set to $g_{av}$ (step 138) and $g_{av}$ is initialized, i.e. samples from the previous step are erased and the moving average is zeroed out (step 141). If the range step is not to be changed or if $g_{av}$ is not valid, the feedforward gain $G_{ff}$ is set equal to last_G (step 142) and the feedback gain $G_{fb}$ is set equal to the residue between the loop gain and the feedforward gain (step 144). Note that the residue can be calculated by subtracting the two gains since they are expressed logarithmically in dB. For values expressed in volts, the residue can be calculated by dividing the two gains.

AGC Circuit with Kalman Filter and Hysteresis

The above described method is appropriate only during steady state conditions, i.e. approximately constant input power. The third embodiment of the invention also provides an AGC circuit that incorporates both Kalman filtering with the restart mechanism and hysteresis.

Figure 9:
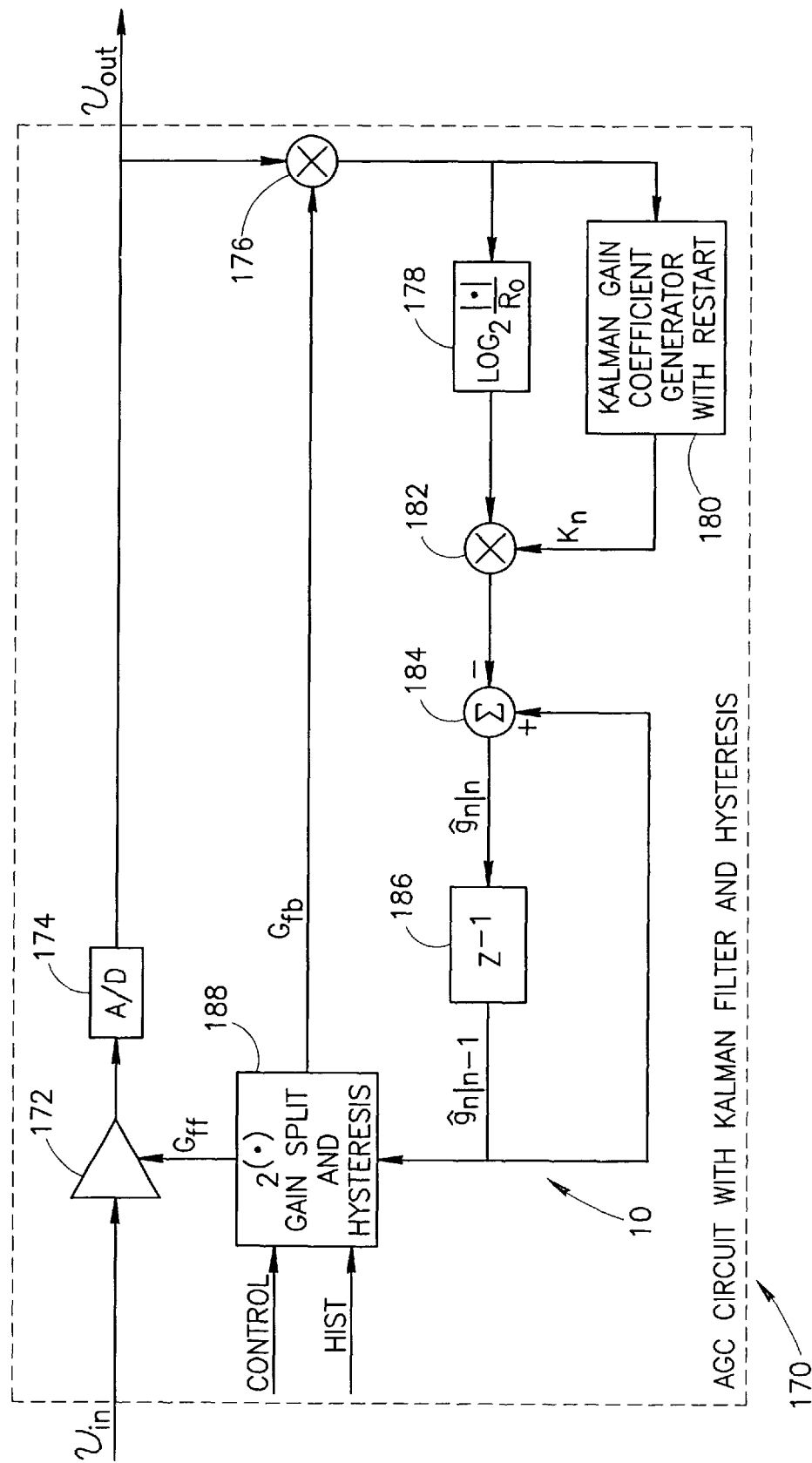
FIG. 9 is a block diagram illustrating a third embodiment of an AGC circuit employing Kalman filtering and hysteresis constructed in accordance with the present invention.

A block diagram illustrating a third embodiment of an AGC circuit employing Kalman filtering and hysteresis constructed in accordance with the present invention is shown in FIG. 9. The AGC circuit, generally referenced 170, comprises an amplifier 172, A/D converter 174, inverse log, gain splitter and hysteresis circuit 188, second gain stage 176, logarithmic block 178, Kalman gain coefficient generator with restart 180, multiplier 182, adder 184 and delay 186.

The occurrence of a restart signifies a sharp change in input power and an ensuing fast update of AGC gain. Thus, suppressing gain fluctuations at restart would normally impair the operation of the AGC circuit. This situation is handled by the algorithm described below.

Figure 10:
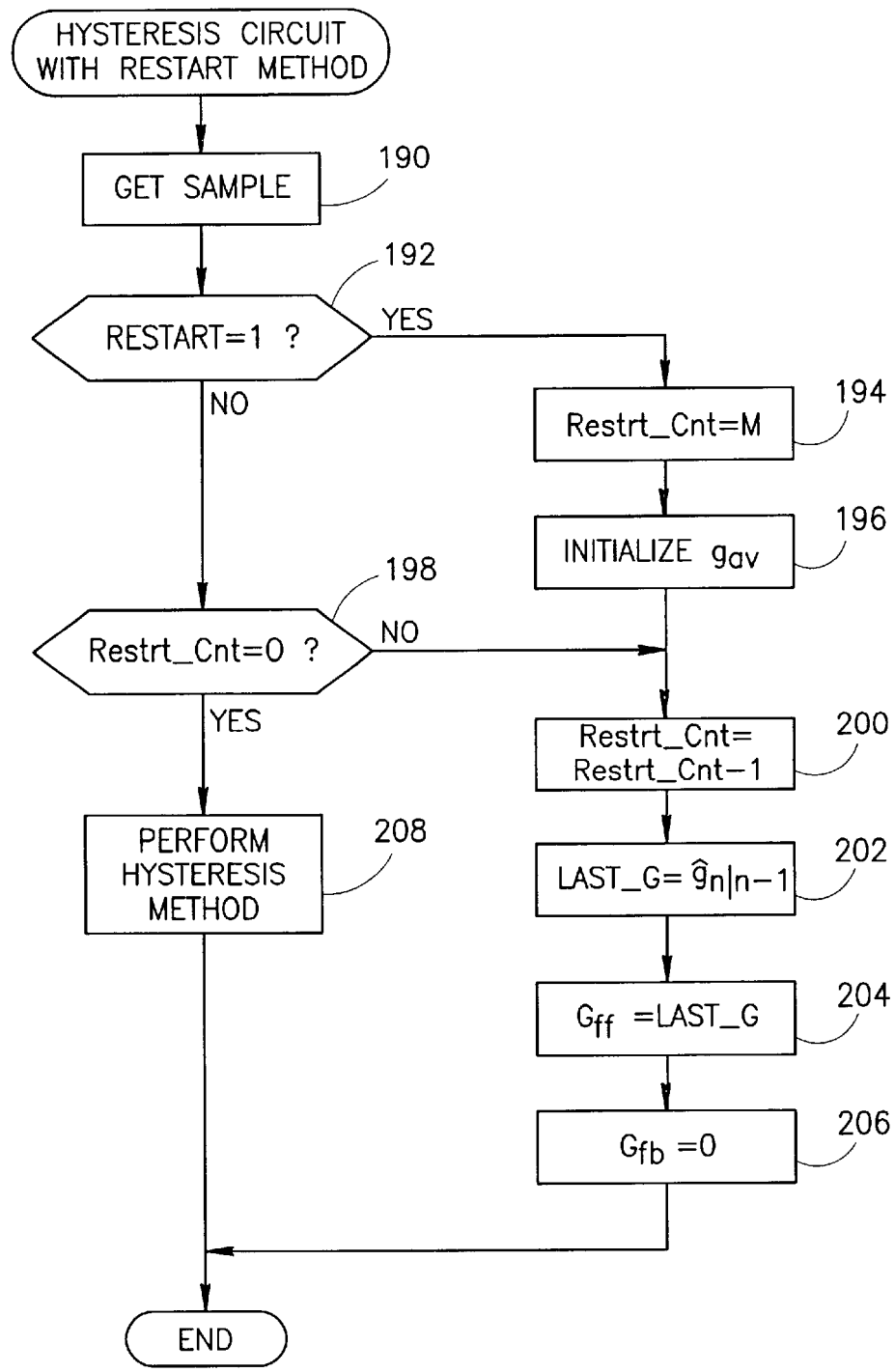
FIG. 10 is a flow diagram illustrating the hysteresis with restart method of the AGC circuit of FIG. 9.

A flow diagram illustrating the hysteresis with restart method of the AGC circuit of FIG. 9 is shown in FIG. 10. Essentially, the method is operative to disable the hysteresis circuit for a certain time period after a restart. This time is denoted in the flow diagram by M, where M is the time duration allowed for settling of the Kalman gain, and N is the number of cycles necessary to calculate the new average $g_{av}$.

The first step is to obtain the next sample (step 190). If a restart has been triggered (step 192), then initialize Restrt_

Cnt to M, where M represents the time duration allowed for settling of the Kalman gain (step 194). The moving average $g_{av}$ is then initialized (step 196). If no restart was triggered, it is checked whether Restrt_Cnt is equal to zero (step 198). If so, i.e. the waiting time period has ended, the hysteresis method of FIG. 8 is performed (step 208).

Otherwise, Restrt_Cnt is decremented (step 200), last_G is set to the current value of the loop gain (step 202), the feedforward gain $G_{ff}$ is set to the value of last_G (step 204) and the feedback gain $G_{fb}$ is set to zero (step 206). In other words, if the waiting time period has not ended, the actual loop gain is applied directly to the gain control of the amplifier, rather than being split into two portions as is normally the case with the hysteresis circuit.

The selection of parameters of the AGC circuit incorporating Kalman filtering and hysteresis will now be presented. As a starting point, the Kalman related parameters are determined as described hereinabove in connection with the first embodiment. The parameters that remain to be determined are the hysteresis related ones and include the amount of hysteresis Hist, depth of memory N in the calculation of the average gain $g_{av}$ and the duration M of inactivity of the circuit following a restart.

Figure 11:
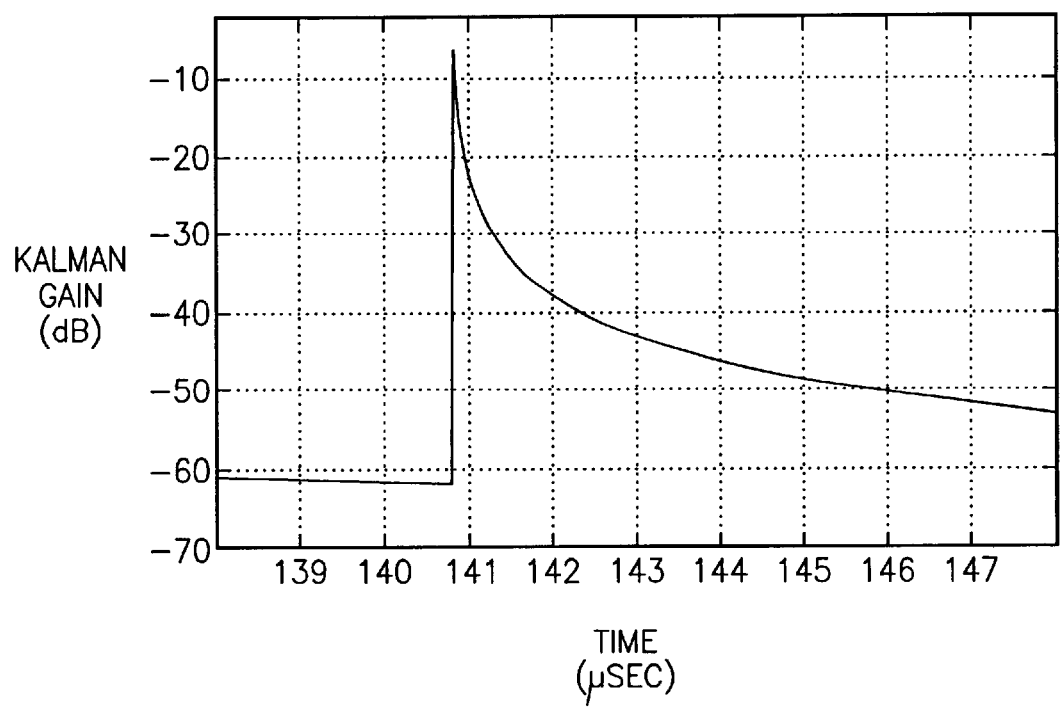
FIG. 11 is a graph illustrating the behavior of the AGC circuit versus time.

In choosing M, it is important to keep in mind that the objective of the design is to have the hysteresis operate as fast as possible after a restart. On the other hand, some time must be allowed to pass until the AGC circuit achieves some coarse equilibrium. To determine the parameter M, the behavior of the Kalman gain following a restart is considered. A graph illustrating the behavior of the AGC circuit versus time is shown in FIG. 11. With reference to trace 100 FIG. 6B and FIG. 10, it can be seen that the main effect of the restart takes place during the first 1 μsec after it occurs.

Thus, the delay parameter is chosen to be $M=1/T_s=64$ samples where $T_s$ is the sampling period derived from the sampling frequency of 64 MHz.

As described supra, the goal of the AGC circuit with hysteresis is to limit the gain fluctuations in the steady state to a range of +/−0.15 dB. Therefore, with a choice of Hist=1 dB this behavior would be expected to be extended to transients as well. The fluctuations following a restart are, however, much larger and hysteresis of 1 dB has been found to be insufficient. Based on simulations described below, a value of Hist=3 dB appears to provide adequate performance in most cases.

To make a selection choice about the depth of memory N, statistical analysis is required. Consider that it is desirable to change the feedforward gain $G_{ff}$ only when the level of the input signal changes by more than Hist/2. The basis for this decision to change $G_{ff}$ comes from the calculation of the sample mean $g_{av}$. The choice of N is dictated by the requirement of limiting the probability of a wrong decision.

The scenario to be simulated is as follows.

Step 1: Choose a relatively difficult channel in order for the simulation to perform well under worst case conditions, including colored noise and highly correlated signal samples.

Step 2: Two types of experiments are performed and statistics are collected for both: (1) the restart is triggered at the end of a packet, followed by channel noise being input to the AGC circuit, and (2) the restart is triggered at the beginning of a packet, followed by samples of an information bearing signal being input to the AGC circuit after being filtered by the channel.

Step 3: Each experiment is performed as follows:
A: Simulate a stream of data containing packets having a duration of 100 μsec and gaps of duration 100 μsec.
B: Following the restart, wait M samples.
C: Execute multiple passes over the next 100 μsec, where in each pass a different N from the range of {0.5, 1} μsec is chosen. For each pass, record the probability that the feedforward gain should be changed (in accordance with the method of FIG. 8) after its initial setting which occurs at the time M+N.

The probability is preferably measured against a grid of hysteresis values, starting with Hist=1 dB.

Figure 12A:
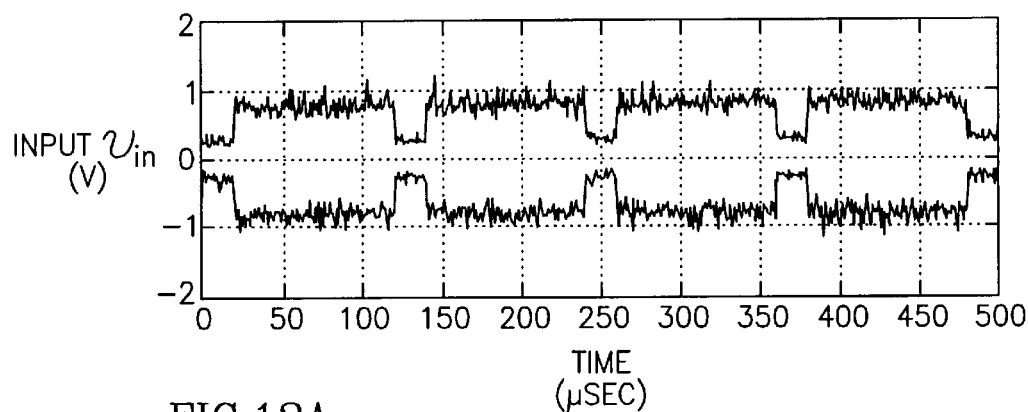
FIGS. 12A, 12B and 12C are signal diagrams illustrating the performance of the third embodiment AGC circuit.
Figure 12B:
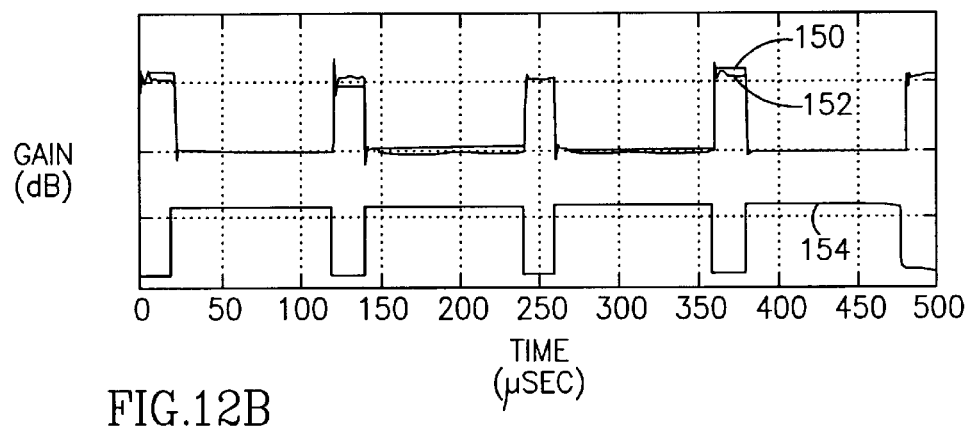
Figure 12C:
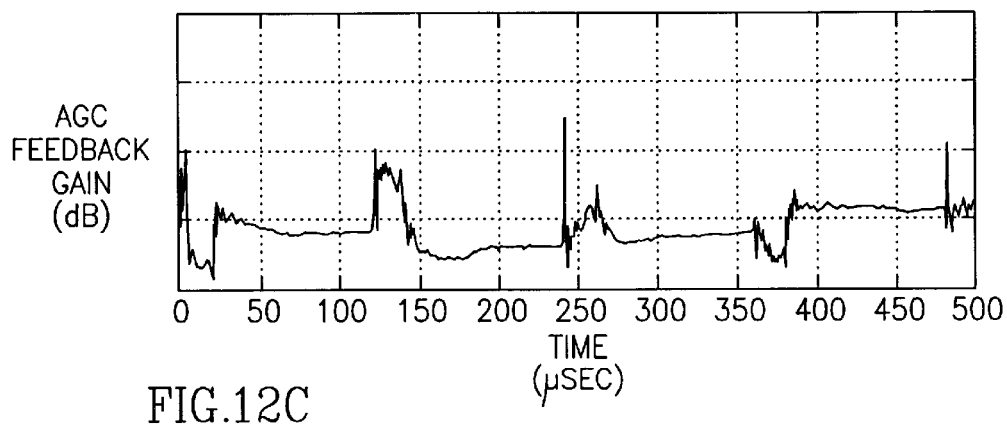
Figure 13A:
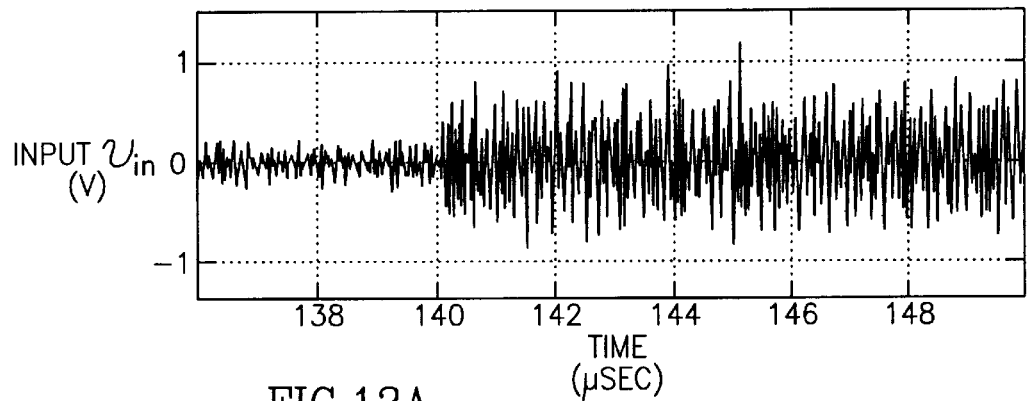
FIGS. 13A, 13B and 13C are signal diagrams illustrating the performance of the third embodiment AGC circuit in more detail.
Figure 13B:
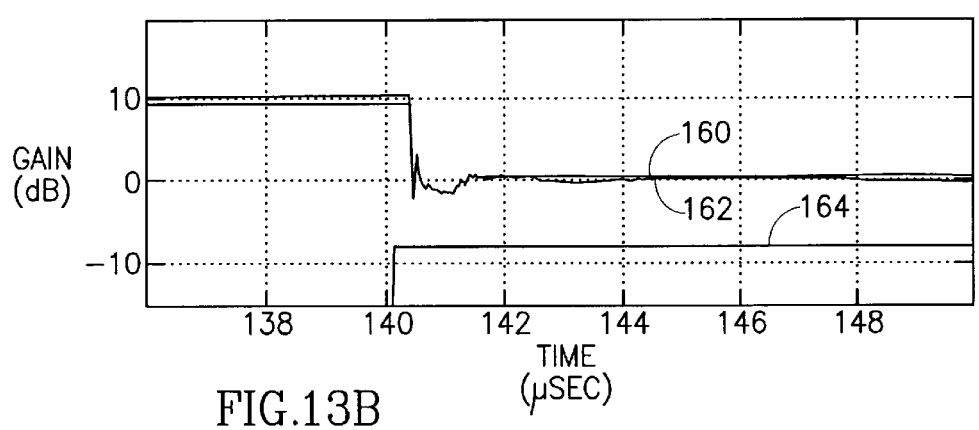
Figure 13C:
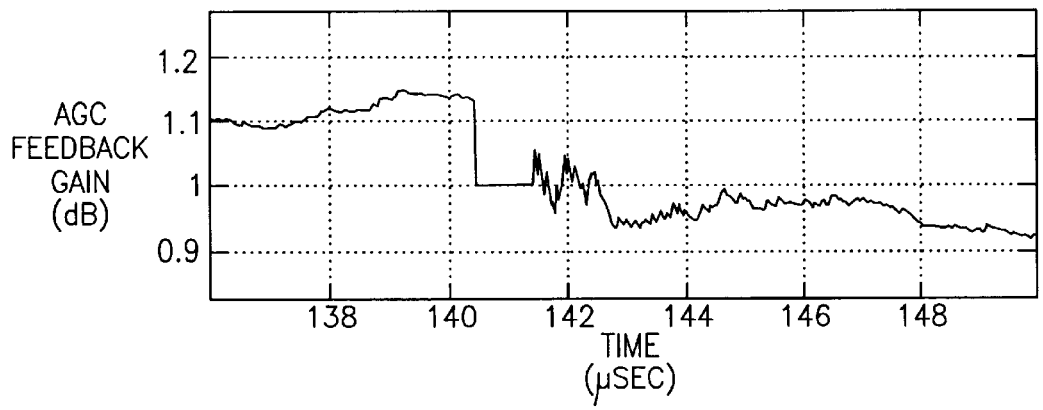

The simulation results presented hereinbelow were executed with a FIFO depth of 0.5 μsec. The simulated example was executed under the same conditions as that of the first embodiment. FIGS. 12A, 12B and 12C are signal diagrams illustrating the performance of the third embodiment AGC circuit with restart and hysteresis. FIGS. 13A, 13B and 13C illustrate portions of the performance in more detail. FIGS. 12A and 13A show the input signal to the AGC circuit. Traces 152, 162 in FIGS. 12B and 13B represent the combined feedforward and feedback gain (i.e. the loop gain). Traces 150, 160 in FIGS. 12B, 13B, respectively, represent the feedforward gain. FIGS. 12C and 13C show the AGC feedback gain.

Note that in FIG. 13C, in accordance with the method of FIG. 10, the gain is set to zero for a time duration of approximately 64 samples (i.e. 1 μsec). During this time, the hysteresis circuit is disabled and the loop gain exactly equals the feedforward gain. Following the delay period, the two gains diverge.

It is noted that the primary purpose for employing hysteresis in the feedback loop is to improve the input/output characteristics during the periods between power transitions. This purpose is valid regardless of whether an AGC circuit controlled by the Kalman filter mechanism described herein. The incorporation of hysteresis into the AGC circuit with Kalman filtering and restarts, however, provides a benefit related to the operation of the restart circuit.

Assume that the AGC circuit is constructed to work in conditions close to its limitations, i.e. when it is required to detect small power transitions (e.g., on the order of 5 dB) due to low SNR. In such cases, it may be necessary to employ a large number of samples in order to achieve a reliable test with a low probability of false alarms, thus entailing long detection times. It might also be necessary to use a large value of q. Both these measures by themselves, may cause a failure in the detection of the transition. This is because the natural adaptation of the Kalman filter may bring the output back too close to the nominal level to be detected by the threshold comparators (FIG. 4) in the restart circuit. The hysteresis mechanism, however, is able to hold the output/input AGC gain constant during the detection period.

The hysteresis circuit of the present invention can also benefit systems wherein the channel is estimated at the start of each packet utilizing, for example, a pseudo noise sync sequence. In such systems, however, the beginning of a packet, would usually be accompanied by a restart with subsequent relatively high gain fluctuations resulting in degradation of the quality of channel estimation. The suppression of these gain fluctuations by the hysteresis circuit of the present invention may improve the channel estimation.

Application of the AGC Circuit in a Communications Receiver

Figure 14:
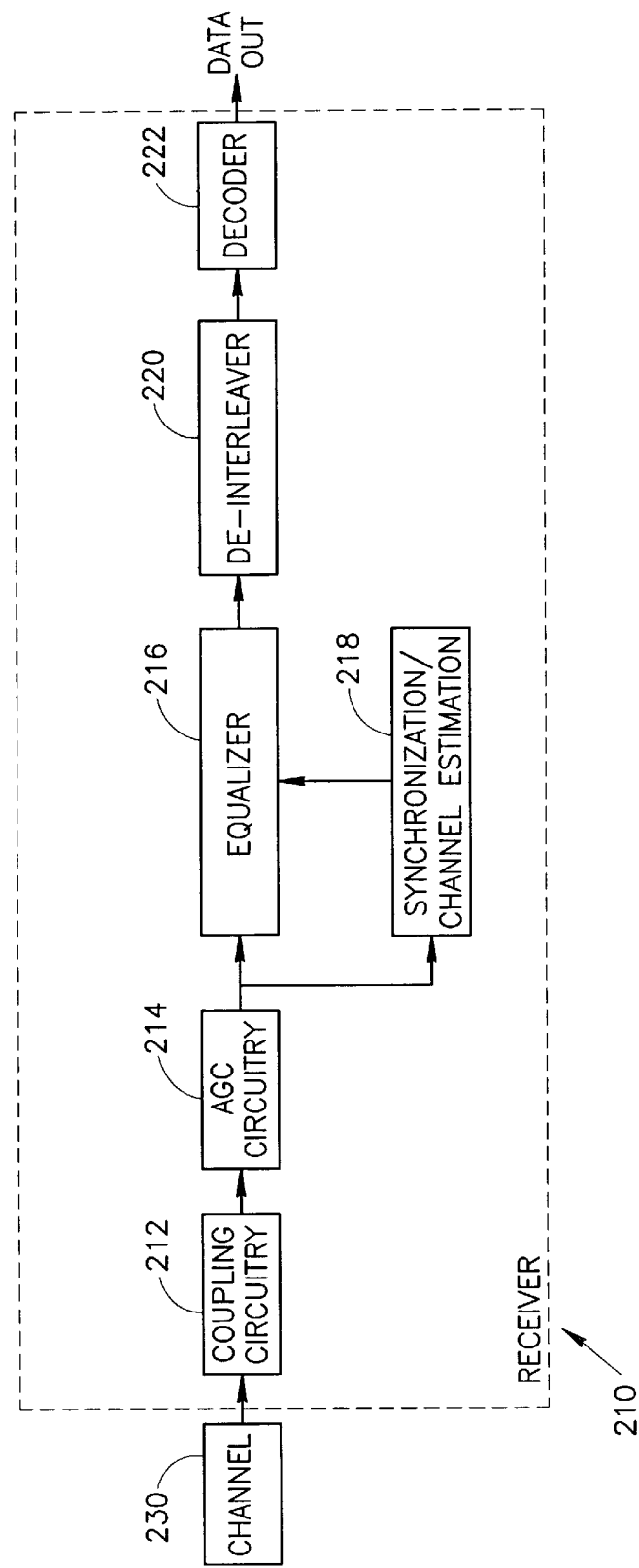
FIG. 14 is a block diagram illustrating the structure of an example concatenated receiver including a dynamic automatic gain control circuit constructed in accordance with the present invention.

A block diagram illustrating the structure of an example concatenated receiver including a dynamic automatic gain control circuit constructed in accordance with the present invention is shown in FIG. 14. The automatic gain control circuit of the present invention is described in the context of a communications receiver. Note the communication receiver shown herein is presented for illustration purposes only and is not meant to limit the scope of the present invention. It is appreciated that one skilled in the communication arts can construct numerous other types of receivers incorporating the automatic gain control circuit of the present invention.

The receiver, generally referenced 210, comprises coupling circuitry 212 connected to the channel media 230, for example the power line, an AGC circuit 214, synchronization/channel estimation 218, equalizer 216, de-interleaver 220 and outer decoder 222.

The signal from the channel is input to the channel coupling circuit which functions as the analog front end for the receiver. The signal output of the channel coupling circuitry is input to the AGC circuit. The AGC circuit incorporates either Kalman filtering with the restart mechanism, the hysteresis circuit or both as described in detail hereinabove in connection with the first, second and third AGC circuit embodiments.

The digitized receive data stream is input to both the equalizer and the synchronization/channel estimation. This module functions to detect the training sequence or sync sequence sent by the transmitter. This module also functions to generate an estimate of the channel.

The channel estimation is operative to generate a channel estimate represented by $h_i$ that is used by the equalizer. The channel estimation is generated using the received input samples x(n). Several methods of channel estimation known in the art are suitable for use with the present invention and include, for example, channel estimate methods utilizing correlation techniques and least squares techniques.

The equalizer is operative to output soft decision information given (1) the received signal from the channel, and (2) channel estimate information h, (e.g., FIR filter taps used to estimate the channel).

The decision information output of the equalizer is input to the de-interleaver 220 before being input to an outer decoder which is preferably an optimal soft decoder. The outer decoder functions to locate and fix errors using the redundancy bits inserted by the encoder in the transmitter. The outer decoder generates the binary receive data. Examples of the outer decoder include convolutional decoders utilizing the Viterbi Algorithm, convolutional Forward Error Correction (FEC) decoders, turbo decoders, etc. Soft input Viterbi decoders have the advantage of efficiently processing soft decision information and providing optimum performance in the sense of minimum sequence error probability.

Note that the interleaver/de-interleaver is optional and may be added to or omitted from the system. In this example, a symbol based interleaver/de-interleaver is used. If a bit based interleaver/de-interleaver is used, some mechanism of mapping soft symbols to bits must be used before the outer decoder.

In operation, the transmitter transmits a modulated signal to the channel. In the example embodiment described herein, the transmitter transmits a binary phase shift keying (BPSK) or quadrature phase shift keying (QPSK) modulated signal to the channel. The equalization technique requires knowledge of the impulse response of the channel $h_i$. This can be obtained using the channel estimation techniques described above. One method of determining $h_i$ is to transmit a training sequence or sync pattern comprising a pseudo noise (PN) sequence. The signals are transmitted grouped together in the form of packets wherein each packet begins with the PN synchronization sequence.

At the receiver, the received signals are input to the AGC circuit and sampled by the A/D converter internal thereto. They are also input to the synchronization module. A correlator (i.e. matched filter) is used to detect the beginning of a packet. The output of the correlator also comprises the impulse response $h_i$ of the channel. The correlation is performed between the received input samples and the expected synchronization sequence which must be known a priori.

Computer Embodiment of the Invention

Figure 15:
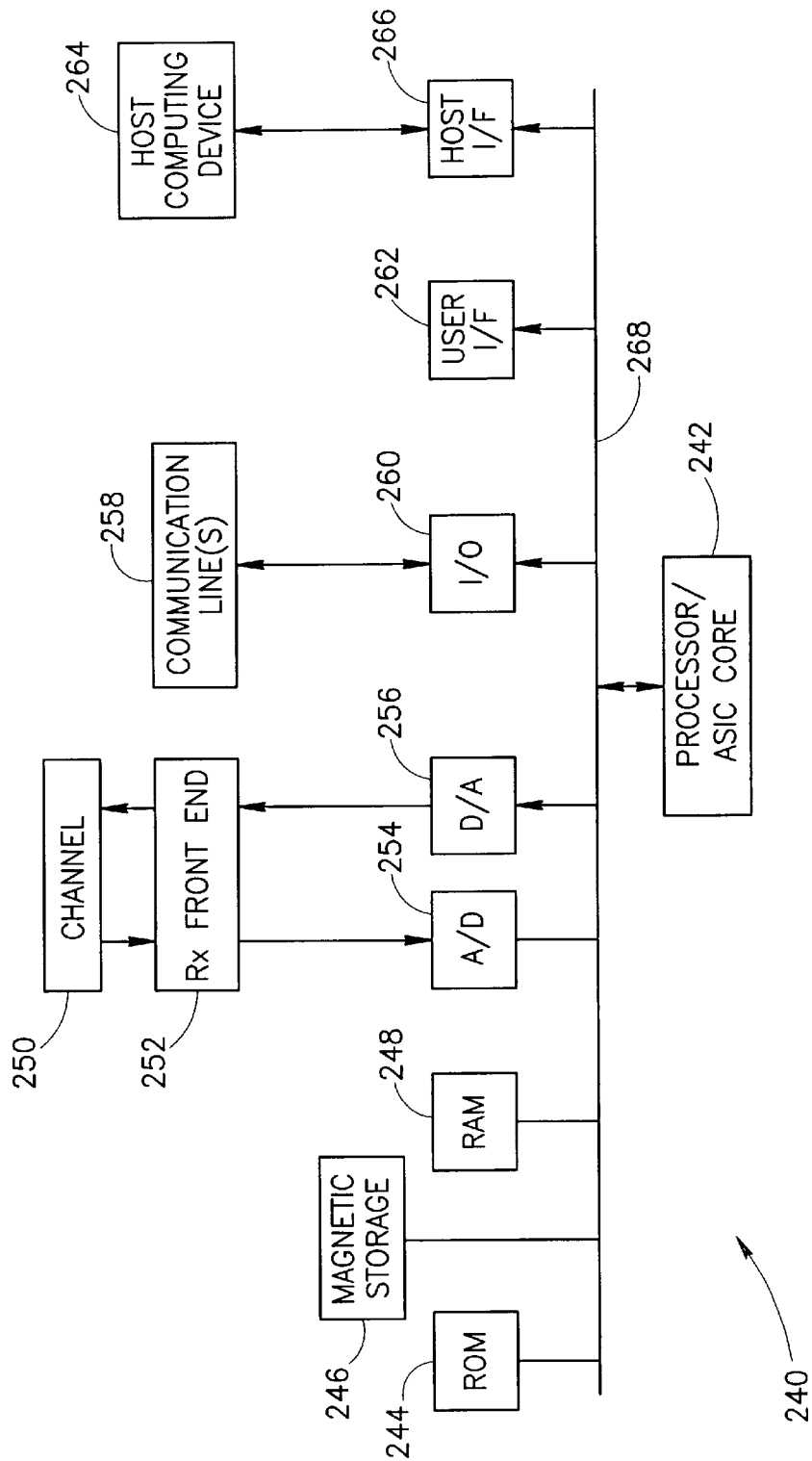
FIG. 15 is a block diagram illustrating an example computer system adapted to perform the dynamic automatic gain control method of the present invention.

In another embodiment, a computer is operative to execute software adapted to perform the automatic gain control with variable gain method of the present invention. A block diagram illustrating an example computer system adapted to perform the automatic gain control with variable gain method of the present invention is shown in FIG. 15. The system may be incorporated within a communications device such as a receiver, part of which is implemented in software.

The computer system, generally referenced 240, comprises a processor or central processing unit (CPU) 242 which may comprise a microcontroller, microprocessor, microcomputer, ASIC processor core or a digital signal processor (DSP). The system also comprises static read only memory (ROM) 244 and dynamic main memory, e.g., random access memory (RAM) 248, all in communication with the processor. The processor is also in communication, via a bus 268, with a number of peripheral devices that are included in the computer system. An A/D converter 254 functions to sample the received signal output of the Rx front end 252 coupled to the channel 250 (e.g., the power line, twisted pair, etc.). A D/A converter 256 converts digital data from the processor to the analog domain and outputs the data onto the channel via the Rx front end.

One or more communication lines 258 are connected to the system via I/O interface 260. A user interface 262 responds to user inputs and provides feedback and other status information. A host interface 266 connects a host device 264 to the system. The host is adapted to configure, control and maintain the operation of the system. The system also comprises magnetic storage device 246 for storing application programs and data. The system comprises computer readable storage medium which may include any suitable memory means including but not limited to magnetic storage, optical storage, semiconductor volatile or non-volatile memory, biological memory devices, or any other memory storage device.

The automatic gain control software is adapted to reside on a computer readable medium, such as a magnetic disk within a disk drive unit. Alternatively, the computer readable medium may comprise a floppy disk, Flash memory card, Electrically Erasable Read Only Memory (EEROM) based memory, bubble memory storage, ROM storage, etc. The software adapted to perform the automatic gain control with variable gain method of the present invention may also reside, in whole or in part, in the static or dynamic main memories or in firmware within the processor of the computer system (i.e. within microcontroller, microprocessor, microcomputer, ASIC processor core, FPGA core internal memory).

In alternative embodiments, the method of the present invention is applicable to implementations of the invention in integrated circuits, field programmable gate arrays (FPGAs), chip sets and especially application specific integrated circuits (ASICs), including wireless implementations and other communication system products.

Further, in other alternative embodiments, the Kalman filter of the present invention can be replaced by other types of loop filters wherein the loop gain signal generated is variable and decreases to a steady state value in response to a restart event wherein a restart event is detected as described supra. The loop gain signal may decrease in any desired linear or non-linear manner, e.g., exponential, logarithmic, etc. It is appreciated that the invention is not limited to use of a Kalman filter in the loop filter. Note that the loop filter parameters may be derived by any suitable means wherein Kalman filtering technique comprises one example.

It is intended that the appended claims cover all such features and advantages of the invention that fall within the spirit and scope of the present invention. As numerous modifications and changes will readily occur to those skilled in the art, it is intended that the invention not be limited to the limited number of embodiments described herein. Accordingly, it will be appreciated that all suitable variations, modifications and equivalents may be resorted to, falling within the spirit and scope of the present invention.

What is claimed is:

1. An automatic gain control (AGC) circuit, comprising:
   an amplifier adapted to receive an input signal and to generate an amplified output signal in accordance with a gain control signal;
   a Kalman filter connected to said amplifier in a feedback loop configuration, said Kalman filter operative to generate a Kalman gain signal in response to the level of said output signal, said Kalman filter comprising a restart mechanism operative to detect sharp transitions in said output signal level and in response thereto, restart said Kalman filter; and
   a control circuit adapted to filter said Kalman gain signal so as to generate said gain control signal.

2. The circuit according to claim 1, wherein said amplifier comprises a variable gain amplifier circuit.

3. The circuit according to claim 1, wherein said Kalman filter comprises a first order Kalman filter during periods of constant output signal level.

4. The circuit according to claim 1, wherein feedback loop including said Kalman filter is configured so as to implement a Kalman gain estimator operative to estimate a random, constant-level signal that sporadically experiences sharp transitions.

5. The circuit according to claim 1, wherein said Kalman filter comprises a table comprising precomputed samples of said Kalman gain signal.

6. The circuit according to claim 1, wherein said restart mechanism is adapted to be activated upon reception of each new packet.

7. The circuit according to claim 1, wherein said restart mechanism comprises means for triggering a restart if an average of a plurality of previous samples of said output signal exceeds an upper threshold or is lower than a lower threshold.

8. The circuit according to claim 1, wherein said restart mechanism comprises means for triggering a restart in response to detection of a sufficiently large transition in signal power level of said output signal.

9. The circuit according to claim 8, wherein said transition in signal power level is detected by means adapted to:

accumulate a moving window of samples, each sample comprising the square of a sample of said output signal; and
trigger a restart if the value of said accumulator exceeds an upper threshold or is smaller than a lower threshold.

10. The circuit according to claim 1, wherein said restart mechanism comprises means for re-initializing a pointer to the beginning of a table storing precomputed samples of said Kalman gain.

11. The circuit according to claim 1, further comprising:
    means for representing said output signal as a logarithm value;
    wherein said Kalman filter is adapted to generate said Kalman gain as a function of said logarithmic representation of said output signal; and
    means for generating an inverse logarithm of said gain control signal before it is input to said amplifier.

12. An automatic gain control (AGC) circuit, comprising:
    an amplifier adapted to receive an input signal and to generate an amplified output signal in accordance with a feedforward gain control signal;
    a loop filter connected to said amplifier in a feedback loop configuration, said loop filter operative to generate a loop gain signal in response to the level of a modified output signal;
    a hysteresis mechanism operative to apply hysteresis to said loop gain signal and as a result thereof, to generate said feedforward gain control signal and an feedback gain control signal; and
    means for removing the effects of hysteresis generated by said hysteresis mechanism so as to generate said modified output signal.

13. The circuit according to claim 12, wherein said hysteresis mechanism is adapted to generate said feedforward gain control signal as the midpoint of a step range.

14. The circuit according to claim 12, wherein said hysteresis mechanism is adapted to generate said feedback gain control signal as the residual between said loop gain and the midpoint of a particular step range.

15. The circuit according to claim 12, wherein said hysteresis mechanism is adapted to maintain a fixed feedforward gain control signal as long as said loop gain signal is within a predetermined distance of a nominal gain level.

16. The circuit according to claim 12, wherein said hysteresis mechanism is adapted to modify said feedforward gain control signal when said loop gain signal is no longer within a current step range.

17. The circuit according to claim 12, wherein said amplifier comprises a variable gain amplifier circuit.

18. The circuit according to claim 12, wherein said loop filter comprises a first order low pass filter.

19. The circuit according to claim 12, wherein said feedback loop including said loop filter is adapted to generate said loop gain in response to a random, constant-level input signal that sporadically experiences sharp transitions.

20. The circuit according to claim 12, wherein said loop filter comprises a table comprising precomputed samples of said loop gain signal.

21. The circuit according to claim 12, further comprising:
    means for representing said output signal as a logarithm value;
    wherein said loop filter is adapted to generate said loop gain as a function of said logarithmic representation of said output signal; and
    means for generating an inverse logarithm of said gain control signal before it is input to said amplifier.

22. The circuit according to claim 12, wherein said means for removing the effects of hysteresis comprises means for multiplying said feedback gain control signal by said output signal so as to yield said modified output signal as a product thereof.

23. A method of automatic gain control (AGC), said method comprising the steps of:
  amplifying an input signal so as to generate an amplified output signal in accordance with an feedforward gain signal;
  processing a modified output signal through a Kalman filter located in a feedback loop so as to generate a Kalman gain signal in response to the level of said modified output signal;
  restarting said Kalman filter in response to the detection of sharp transitions in said output signal level;
  filtering said Kalman gain signal and generating a loop gain signal in response thereto;
  applying hysteresis to said loop gain signal and as a result thereof, generating said feedforward gain control signal and an feedback gain control signal; and
  removing the effects of hysteresis from said output signal to generate said modified output signal.

24. The method according to claim 23, wherein said step of applying hysteresis comprises setting said feedforward gain control signal to the midpoint of a step range.

25. The method according to claim 23, wherein said step of applying hysteresis comprises generating said feedback gain control signal as the residual between said loop gain and the midpoint of a particular step range.

26. The method according to claim 23, wherein said step of hysteresis comprises maintaining a fixed feedforward gain control signal as long as said loop gain signal is within a predetermined distance of a nominal gain level.

27. The method according to claim 23, wherein said step of hysteresis comprises modifying said feedforward gain control signal when said loop gain signal is no longer within a current step range.

28. The method according to claim 23, wherein said Kalman filter comprises a first order Kalman filter during periods of constant output signal level.

29. The method according to claim 23, wherein feedback loop including said Kalman filter is configured so as to implement a Kalman gain estimator operative to estimate a random, constant-level signal that sporadically experiences sharp transitions.

30. The method according to claim 23, wherein said Kalman filter comprises a table comprising precomputed samples of said Kalman gain signal.

31. The method according to claim 23, further comprising the steps of:
  representing said output signal as a logarithm value;
  wherein said Kalman filter generates said Kalman gain as a function of said logarithmic representation of said output signal; and
  generating an inverse logarithm of said gain control signal before it is input to said amplifier.

32. The method according to claim 23, wherein said step of removing the effects of hysteresis comprises multiplying said feedback gain control signal by said output signal so as to yield said modified output signal as a product thereof.

33. The method according to claim 23, wherein said step of restarting said Kalman filter is performed upon reception of each new packet.

34. The method according to claim 23, wherein said step of restarting said Kalman filter comprises triggering a restart if an average of a plurality of previous samples of said output signal exceeds an upper threshold or is lower than a lower threshold.

35. The method according to claim 23, wherein said step of restarting said Kalman filter comprises triggering a restart in response to the detection of a sufficiently large transition in signal power level of said output signal.

36. The method according to claim 35, wherein said transition in signal power level is detected by the steps of:
  accumulating a moving window of samples, each sample comprising the square of a sample of said output signal; and
  triggering a restart if the accumulated value exceeds an upper threshold or is smaller than a lower threshold.

37. The method according to claim 23, wherein said step of restarting said Kalman filter comprises the step of re-initializing a pointer to the beginning of a table storing precomputed samples of said Kalman gain.

38. The method according to claim 23, wherein hysteresis is disabled for a predetermined time duration following the triggering of a restart.

39. A communications receiver for receiving and decoding an M-ary transmitted signal transmitted over a channel having an impulse response $h_i$, comprising:
  a front end circuit for receiving and converting said M-ary transmitted signal to a baseband signal;
  a demodulator adapted to receive said baseband signal and to generate a received signal therefrom in accordance with the M-ary modulation scheme used to generate said transmitted signal;
  an automatic gain control (AGC) circuit operative to receive said received signal and to generate an output signal therefrom, said AGC circuit comprising processing means programmed to:
    amplify said received signal so as to generate an amplified output signal in accordance with an feedforward gain signal;
    process a modified output signal through a Kalman filter located in a feedback loop so as to generate a Kalman gain signal in response to the level of said modified output signal;
    restart said Kalman filter in response to the detection of sharp transitions in said output signal level;
    filter said Kalman gain signal and generating a loop gain signal in response thereto;
    apply hysteresis to said loop gain signal and as a result thereof, generating said feedforward gain control signal and an feedback gain control signal;
    remove the effects of hysteresis from said output signal to generate said modified output signal;
  an equalizer operative to receive said received signal and to generate a sequence of soft symbol decisions therefrom;
  a decoder adapted to receive said soft symbol values and to generate binary received data therefrom; and
  wherein M is a positive integer.

40. The receiver according to claim 39, wherein said decoder comprises a convolutional decoder based on the Viterbi Algorithm (VA).

41. The receiver according to claim 39, wherein said M-ary symbol comprises a 2-PSK symbol (Binary PSK (BPSK)).

42. The receiver according to claim 39, wherein said M-ary symbol comprises a 4-PSK symbol (Quadrature PSK (QPSK)).

43. The receiver according to claim 39, further comprising a de-interleaver adapted to receive soft symbol values and whose output is subsequently input to said decoder for decoding into binary data therefrom.

44. The receiver according to claim 39, wherein said processing means is programmed to apply hysteresis by maintaining a fixed feedforward gain control signal as long as said loop gain signal is within a predetermined distance of a nominal gain level.

45. The receiver according to claim 39, wherein said processing means is programmed to disable hysteresis for a predetermined time duration following the triggering of a restart.

46. The receiver according to claim 39, wherein said processing means is programmed to restart said Kalman filter by triggering a restart in response to the detection of a sufficiently large transition in signal power level of said output signal.

47. The receiver according to claim 46; wherein said processing means is programmed to detect said transition in signal power level by performing the steps of:

accumulating a moving window of samples, each sample comprising the square of a sample of said output signal; and triggering a restart if the accumulated value exceeds an upper threshold or is smaller than a lower threshold.

48. An electronic data storage media storing a computer program adapted to program a computer to execute the soft output generator process of claim 38.

49. A computer readable storage medium having a computer program embodied thereon for causing a suitably programmed system to automatically control the gain of an input signal by performing the following steps when such program is executed on said system:

amplifying said input signal so as to generate an amplified output signal in accordance with an feedforward gain signal;

processing a modified output signal through a Kalman filter located in a feedback loop so as to generate a Kalman gain signal in response to the level of said modified output signal;

restarting said Kalman filter in response to the detection of sharp transitions in said output signal level;

filtering said Kalman gain signal and generating a loop gain signal in response thereto;

applying hysteresis to said loop gain signal and as a result thereof, generating said feedforward gain control signal and an feedback gain control signal; and removing the effects of hysteresis from said output signal to generate said modified output signal.

50. The computer readable storage medium according to claim 49, wherein said method is performed in a communications receiver adapted to receive and decode a 2-PSK signal (Binary PSK (BPSK)).

51. The computer readable storage medium according to claim 49, wherein said method is performed in a communications receiver adapted to receive and decode a 4-PSK signal (Quadrature PSK (QPSK)).

52. The computer readable storage medium according to claim 49, wherein said step of applying hysteresis comprises maintaining a fixed feedforward gain control signal as long as said loop gain signal is within a predetermined distance of a nominal gain level.

53. The computer readable storage medium according to claim 49, wherein hysteresis is disabled for a predetermined time duration following the triggering of a restart.

54. The computer readable storage medium according to claim 49, wherein said step of restarting said Kalman filter comprises triggering a restart in response to the detection of a sufficiently large transition in signal power level of said output signal.

55. The computer readable storage medium according to claim 54, wherein said transition in signal power level is detected by performing the steps of:

accumulating a moving window of samples, each sample comprising the square of a sample of said output signal;

triggering a restart if the accumulated value exceeds an upper threshold; and triggering a restart if the accumulated value is smaller than a lower threshold.

56. An automatic gain control (AGC) circuit, comprising:

an amplifier adapted to receive an input signal and to generate an amplified output signal in accordance with a feedforward gain control signal;

a loop filter connected to said amplifier in a feedback loop configuration, said loop filter operative to generate said feedforward loop gain signal in response to the level of a modified output signal, wherein the magnitude of said loop gain signal exponentially decreases after a restart event; and a restart mechanism operative to detect sharp transitions in said output signal level and in response thereto, to trigger said restart event.

* * * * *